(12) United States Patent
Kalyanamahadevi Gopalan Jawarlal et al.

(10) Patent No.: US 11,469,746 B2
(45) Date of Patent: Oct. 11, 2022

(54) INTEGRATED DEVICE HAVING PHASE INTERPOLATOR AND INPUT CONTROLLER THEREOF

(71) Applicant: Samsung Electronics Co., Ltd., Suwon-si (KR)

(72) Inventors: Vishnu Kalyanamahadevi Gopalan Jawarlal, Bangalore (IN); Gunjan Mandal, Bangalore (IN); Avneesh Singh Verma, Bangalore (IN); Sanjeeb Kumar Ghosh, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/352,516

(22) Filed: Jun. 21, 2021

(65) Prior Publication Data

US 2022/0231676 A1 Jul. 21, 2022

(30) Foreign Application Priority Data

Jan. 19, 2021 (IN) .............................. 202141002478

(51) Int. Cl.
*H03K 5/135* (2006.01)
*H03L 7/081* (2006.01)
*H03K 5/133* (2014.01)

(52) U.S. Cl.
CPC ............. *H03K 5/135* (2013.01); *H03K 5/133* (2013.01); *H03L 7/081* (2013.01)

(58) Field of Classification Search
CPC ........ H03K 5/131; H03K 5/133; H03K 5/135; H03L 7/081; H03L 7/0814; H03L 7/0812; H03L 7/0816; H03L 7/0807; H03L 7/093; H03L 7/096; H03L 7/0998; H03L 7/0891; H03L 7/087; H03L 7/085; H03L 7/0818; H03L 7/08; H03L 7/10; H03L 7/07; H03L 7/0992
See application file for complete search history.

(56) References Cited

U.S. PATENT DOCUMENTS 6,671,341 B1 12/2003 Kinget et al.
7,180,329 B1 2/2007 Sia et al.
7,554,360 B1 6/2009 Jiang
(Continued)

OTHER PUBLICATIONS

N. Krishnapura and P. R. Kinget, "A 5.3-GHz programmable divider for HiPerLAN in 0.25-/spl mu/m CMOS," IEEE Journal of Solid-State Circuits, Jul. 2000, vol. 35, No. 7, pp. 1019-1024.
(Continued)

*Primary Examiner* — John W Poos
(74) *Attorney, Agent, or Firm* — Muir Patent Law, PLLC

(57) ABSTRACT

An integrated circuit device includes a sensing circuit configured to determine a delay code from a plurality of delay codes using a phase interpolation (PI) code and a plurality of input clock phases, a variable delay circuit coupled to the sensing circuit and configured to generate a variable delay based on the delay code and generate a delayed PI code using the PI code and the delay code, the delayed PI code corresponding to a code obtained from adding the variable delay to the PI code, and a phase interpolator coupled to the variable delay circuit and configured to generate an output clock phase from the plurality of input clock phases using the delayed PI code.

20 Claims, 18 Drawing Sheets

(56) References Cited

U.S. PATENT DOCUMENTS

| | | | |
|---|---|---|---|
| 8,253,454 B2* | 8/2012 | Lin | H03L 7/07 |
| | | | 327/147 |
| 9,379,881 B1 | 6/2016 | Chi et al. | |
| 9,537,475 B1 | 1/2017 | Torga | |
| 11,005,479 B2* | 5/2021 | Im | H03L 7/0814 |
| 2002/0070783 A1* | 6/2002 | Saeki | G06F 1/10 |
| | | | 327/235 |
| 2005/0180536 A1 | 8/2005 | Payne et al. | |
| 2006/0164132 A1 | 7/2006 | Martin et al. | |
| 2009/0045856 A1* | 2/2009 | Spirkl | H03L 7/0814 |
| | | | 327/158 |
| 2010/0123498 A1* | 5/2010 | Bae | H03L 7/087 |
| | | | 327/158 |
| 2016/0373115 A1* | 12/2016 | Lee | H03L 7/081 |

OTHER PUBLICATIONS

Wang, Keping, et. al., "Phase-interpolator-based glitch-free fractional frequency divider with track-and-hold technique," Electronics Letters, 2019, p. 883-884, vol. 55, Issue 16.

Extended European Search Report dated Jun. 20, 2022 for corresponding EP Patent Application No. 22152329.3.

* cited by examiner

FIG. 1C
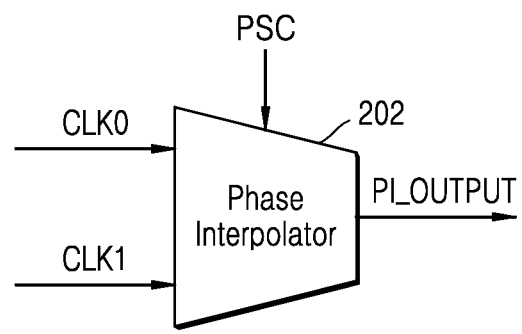
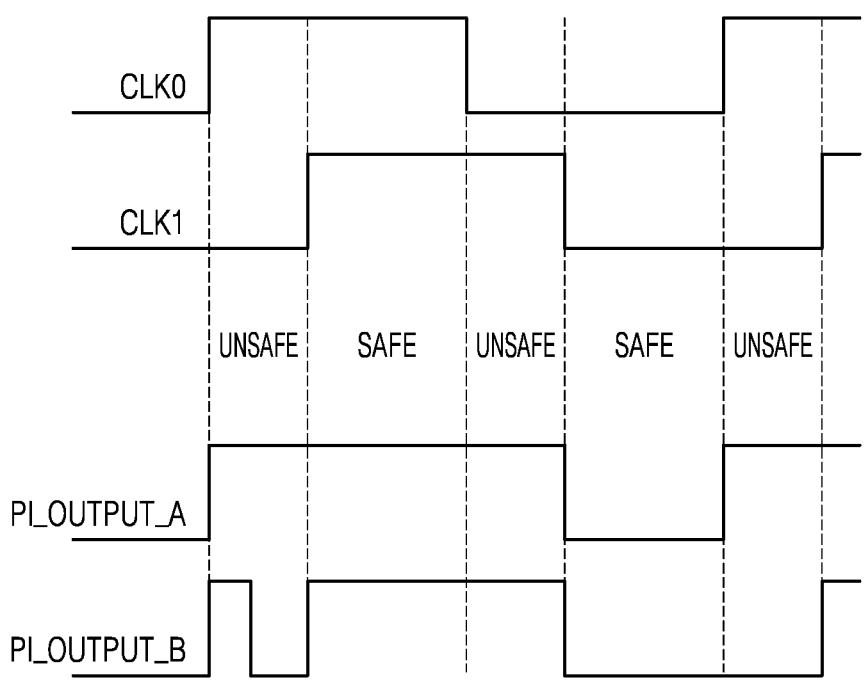

FIG. 5E

| INPUT A | INPUT B | INPUT C | SAMPLER LOGIC FUNCTION OUTPUT |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

FIG. 6

| Early Value | Middle Value | Late Value | Decision Output | Comments |
|---|---|---|---|---|
| 0 | 0 | 0 | 0 | Expected steady state condition |
| 0 | 0 | 1 | −1 | Move towards early delay code EDC |
| 0 | 1 | 0 | 1 | Can move in either direction. Choose movement towards late delay code LDC |
| 0 | 1 | 1 | −1 | Move towards early delay code EDC to code 001 and then 000 |
| 1 | 0 | 0 | 1 | Move towards delay code LDC |
| 1 | 0 | 1 | 0 | Can occur if the delay step is very large (o.25 TVCO) or if there is some other error. Stay at the same delay code since centre delay code CDC shows no error |
| 1 | 1 | 0 | 1 | Move towards late delay code LDC to code 001 and then 000 |
| 1 | 1 | 1 | 1 | Can move in either direction. Choose movement towards late delay code LDC |

INTEGRATED DEVICE HAVING PHASE INTERPOLATOR AND INPUT CONTROLLER THEREOF

CROSS-REFERENCE TO RELATED APPLICATION

This application claims priority under 35 U.S.C. § 119 to Indian Patent Application No. 202141002478 filed on Jan. 19, 2021 in the Indian Patent Office, the disclosure of which is incorporated by reference herein in its entirety.

TECHNICAL FIELD

The present disclosure relates to integrated circuits and more particularly to controlling a phase selection input of a phase interpolator in an integrated circuit.

BACKGROUND

A phase interpolator is used in an integrated circuit device (for example, a transceiver, a phase locked loop (PLL) circuit, a delay locked loop (DLL) circuit, a clock and data recovery (CDR) circuit, and so on. The integrated circuit operates according to timing clock signals and includes a frequency and phase tracking function. The phase interpolator generates an output clock phase (a clock output with a single phase) from multiple input clock phases (a clock input with different phases) using at least one phase selection code. The output clock phase lies between any two of the multiple input clock phases. The phase selection code may be updated during a small window of time depending on a phase resolution of the input clock phases. However, failure to update the phase selection code during such a window of time may result in glitches and false clock edges at the output clock phase, which leads to false frequency lock. Furthermore, the occurrence of the glitches is sensitive to device corner, supply voltage, temperature, clock frequency and input clock phase rise/fall time. Throughout the specification, the terms such as "clock phases", "clock signal phases" "input clock phases", and so on may refer to clock signals with different phases, and the terms such as a "clock phase", a "clock signal phase", an "output clock phase", and so on may refer to a clock signal with a single phase.

FIG. 1a depicts an example fractional-N Phase Locked Loop (PLL) including a phase interpolator. As depicted in FIG. 1a, the PLL includes a phase frequency detector (PFD) 1102, a charge pump 1104, a loop filter 1106, a voltage controlled oscillator (VCO) 1108, a post divider 1110, a phase interpolator 202, a sigma-delta modulator (SDM) 1112 (i.e., a sigma-delta modulator circuit), a dual divider 1114, and a feedback divider 1116.

The PFD 1102 receives a reference clock signal REF_CLK and a VCO feedback signal FB_CLK from the feedback divider 1116. The PFD 1102 compares the phases of the reference clock signal REF_CLK and the VCO feedback signal FB_CLK signal and generates an error signal. The error signal represents a phase difference between the reference clock signal REF_CLK and the VCO feedback signal FB_CLK. The charge pump 1104 generates an output current that represents the phase difference between the reference clock signal REF_CLK and the VCO feedback signal FB_CLK, and feeds the output current to the loop filter 1106. The loop filter 1106 serves as a low pass filter for removing high frequency noise from the output current of the charge pump 1104, and generates an output voltage. The loop filter 1106 provides the output voltage as the control voltage to the VCO 1108. The VCO 1108 generates an output signal including multiple clock phases. The post divider 1110 divides the output signal generated by the VCO 1108 to produce an output signal PLL OUTPUT.

In a feedback path, the VCO 1108 generates and feeds multiple clock phases INPUT_CK to the phase interpolator 202 as multiple input clock phases. The phase interpolator 202 further receives a phase interpolator (PI) code PSC (i.e., a phase selection code) from the SDM 1112 for generating an output clock phase from the received multiple input clock phases. The PI code PSC may represent a mapping function that includes information about a number of input clock phases to be selected from the multiple clock phases INPUT_CK, and an interpolation function to be applied on the selected input clock phases. Examples of the interpolation function may be, but is not limited to, a linear weighting of the multiple input clock phases, a sinusoidal function, and so on. According to the PI code PSC, the phase interpolator 202 chooses/selects at least two of the multiple input clock phases INPUT_CK, and applies an interpolation function on the selected input clock phases to interpolate the selected input clock phases, thereby to generate an output clock phase PI_OUTPUT. In an example embodiment, the output clock phase PI_OUTPUT may be determined from at least two input clock phases using an interpolation function. The phase interpolator 202 provides the output clock phase PI_OUTPUT to the feedback divider 1116. The feedback divider 1116 divides the output clock phase PI_OUTPUT of the phase interpolator 202 to generate the VCO feedback signal REF_CLK that has a frequency equal to the reference clock signal REF_CLK on an average.

FIG. 1b shows an operation of the phase interpolator 202 of FIG. 1a. The phase interpolator 202 receives eight input clock phases CLK<0> to CLK<7> from the VCO 1108, and the PI code PSC (for example, SEL_PH<15:0>) from the SDM 1112. The eight clock phases CLK<0> to CLK<7> are 45° apart. In an example embodiment, the phase interpolator 202 may be coupled with a waveform shaping circuit WSH that increases rise/fall time of the multiple clock phases INPUT_CK generated from the VCO 1108 for smooth interpolation. For example, the waveform shaping circuit WSH receives eight clock phases VCO_CLK <7:0> from the VCO 1108 and generate the 8 input clock phases CLK<0> to CLK <7> as output clock signals of the wave form shaping circuit WSH. According to the received PI code PSC from the SDM 1112, the phase interpolator 202 selects any of the two adjacent clock phases (for example, 0° and 45°, or 45° and 90°, or the like) from the 8 input clock phases CLK<0> to CLK <7>, and applies the mapping function on the selected two clock phases to generate an output clock phase PI_OUTPUT. The output clock phase PI_OUTPUT lies between the selected two clock phases. The output clock phase PI_OUTPUT has better resolution compared to the input clock phases CLK<0> to CLK<7>. In an example herein, the phase interpolator provides the output clock phase of 22.5° with (¹⁄₁₆) resolution.

The SDM 112 includes logics implemented to analyze the output clock phase PI_OUTPUT generated by the phase interpolator 202, and to generate the PI code PSC. The SDM 1112 may update/change/switch the PI code PSC in response to a sigma delta clock (SDC) generated by the dual divider 1114. In conventional approaches, the PI code PSC is generated and changed only at a specific instance of time/window of time. The window of time (referred hereinafter to as a safe zone) may be defined depending on phase resolution of the input clock phases CLK <7:0>, for example. In an example, the safe zone may be defined as a time window during which all the used input clock phases are at the same logic level. For example, a time period during which the 8 input clock phases CLK<0> to CLK<7> are at the same logic level is referred to as the safe zone.

In the conventional approaches, the PI code PSC may be generated and changed in the safe zone only if the PLL is operating at lower frequencies (for example, less than 2 Giga Hertz (GHz) such as 10 KHz, 100 KHz, or the like). However, it is difficult to generate and change the PI code PSC in the safe zone, if the PLL is operating at higher frequencies (for example, greater than 2 GHz). At the higher frequencies, the generation and changing of the PI code PSC may be asynchronous with respect to the input clock phases CLK<0> to CLK<7>, which may cause glitches in the output clock phase PI_OUTPUT. Due to the glitches, the feedback divider 1116 may count the wrong number of edges, and change erroneously the frequency of the PLL.

FIG. 1c shows the phase interpolator 202 receiving two input clock phases (CLK<0> and CLK<1>) from the VCO 1108, and the PI code PSC from the SDM 1112. For the simplicity of description, the phase interpolator 202 is assumed to receive two input clock phases CLK<0> and CLK<1>. The PI code PSC has to be changed/switched/updated only during the safe zone. The safe zone may be defined as a window of time during which the two input clock signals CLK<0> and CLK<1> are at the same logic level. The changing/switching of the PI code PSC in the safe zone may result in zero glitches at the output clock phase PI_OUTPUT A. The changing/switching of the PI code PSC in an unsafe zone (wherein the two input clock phases are not at the same logic level) may change the output phase clock PI_OUTPUT B, thereby causing the glitches in the output clock phase PI_OUTPUT. When the PLL operates at the higher frequencies (for example, greater than 2 GHz), the safe zone may be defined as a small window of time, which is not sufficient for changing the PI code PSC. Therefore, it may be difficult to change/switch the PI code PSC in such a small window of time, which further causes glitches in the output clock phase PI_OUTPUT.

Thus, in the conventional approaches, the phase interpolator 202 may receive the PI code PSC with unknown phase relationship to the input clock phases INPUT_CK, which may result in glitches in the output clock phase PI_OUTPUT.

OBJECTS

The principal object of the embodiments herein is to disclose methods and systems for controlling an input of a phase interpolator in an integrated circuit.

Another object of the embodiments herein is to disclose methods and systems for generating a delayed phase interpolator (PI) code and providing the delayed PI code as the input to the phase interpolator, wherein the delayed PI code has a known phase relationship to an input clock.

Another object of the embodiments herein is to disclose methods and systems for enabling the phase interpolator to use the delayed PI code to generate the output clock phase from multiple input clock phases, wherein the delayed PI code ensures zero glitches at the output clock phase.

Another object of the embodiments herein is to disclose methods and systems for implementing and enabling a variable delay circuit in a PI code generation path to generate the delayed PI code by adding and controlling at least one delay in a PI code.

Another object of the embodiments herein is to disclose methods and systems for varying the delay of the PI code by sensing relative time spacing between the PI code, and the input clock, and determining if switching of the PI code results in a safe zone, or an unsafe zone.

SUMMARY

According to an exemplary embodiment, an integrated circuit device includes a sensing circuit configured to determine a delay code from a plurality of delay codes using a phase interpolation (PI) code and a plurality of input clock phases, a variable delay circuit coupled to the sensing circuit and configured to generate a variable delay based on the delay code and generate a delayed PI code using the PI code and the delay code, the delayed PI code corresponding to a code obtained from adding the variable delay to the PI code, and a phase interpolator coupled to the variable delay circuit and configured to generate an output clock phase from the plurality of input clock phases using the delayed PI code.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the drawings, in which:

FIG. 1c depicts switching of a phase selection code causing glitches at an output of the phase interpolator;

FIGS. 5a-5f depict the sensing circuitry operating in a dynamic calibration mode for generating the delay code by controlling the set/initialized delay code, according to embodiments as disclosed herein;

FIG. 6 depicts a logic-mapping table used to generate a decision output, according to embodiments as disclosed herein;

DETAILED DESCRIPTION

Figure 1A:
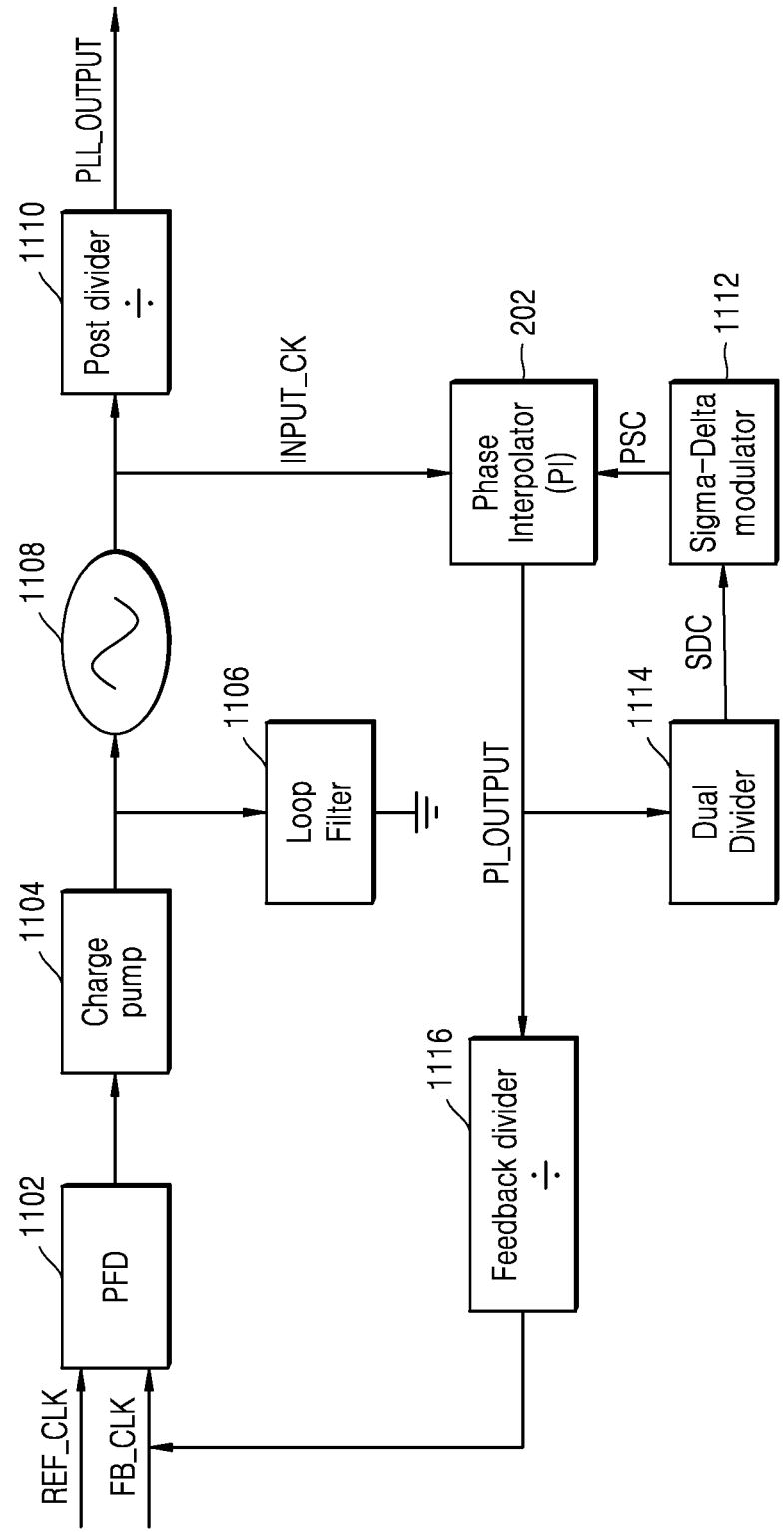
FIG. 1a depicts an example fractional-N Phase Locked Loop (PLL) including a phase interpolator.
Figure 1B:
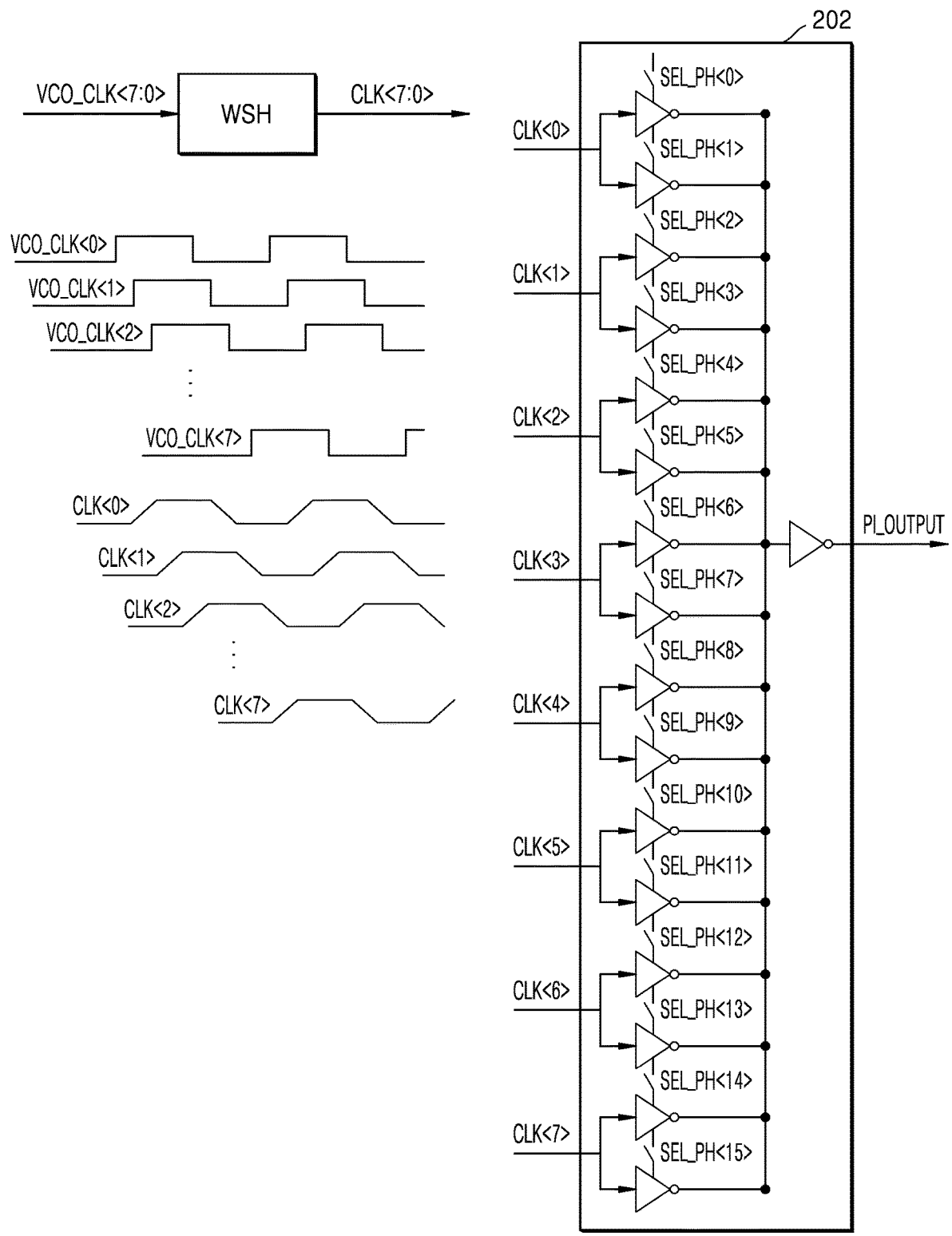
FIG. 1b depicts the phase interpolator.

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein may be practiced and to further enable those of skill in the art to practice the example embodiments herein. Accordingly, this disclosure should not be construed as limiting the scope of the example embodiments herein.

Embodiments herein disclose methods and systems for controlling an input code of a phase interpolator to generate an output clock phase with zero glitches in an integrated circuit device.

Referring now to the drawings, and more particularly to FIGS. 2 through 11, where similar reference characters denote corresponding features consistently throughout the figures, there are shown example embodiments. Throughout the specification, the terms such as "clock phases", "clock signal phases" "input clock phases", and so on may refer to clock signals with different phases, and the terms such as a "clock phase", a "clock signal phase", an "output clock phase", and so on may refer to a clock signal with a single phase.

Figure 2:
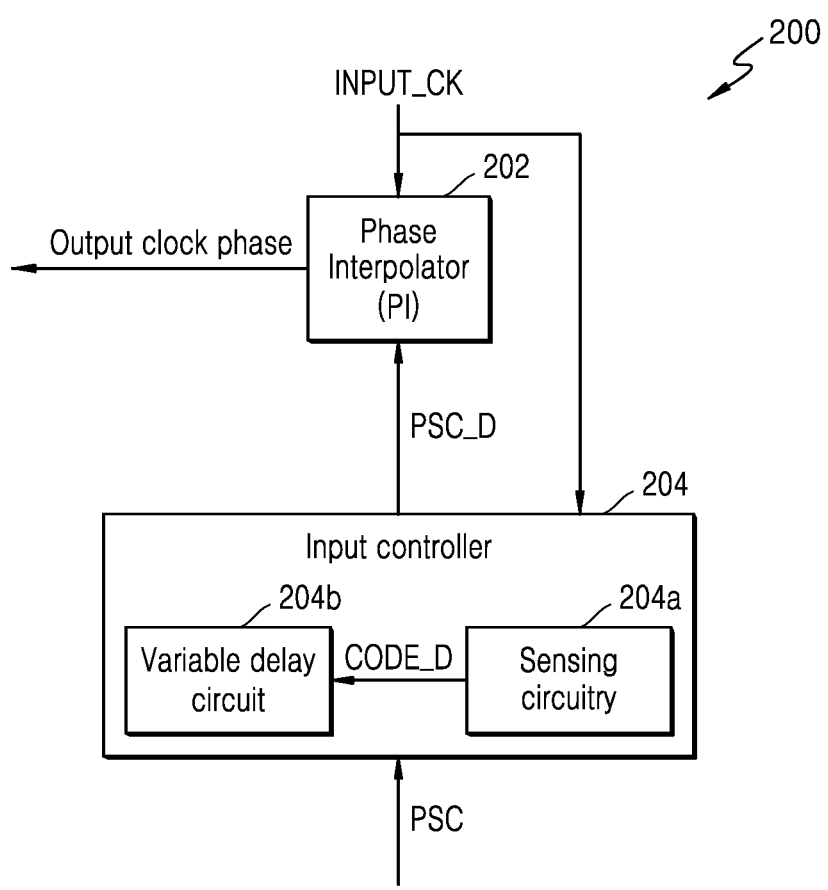
FIG. 2 depicts an integrated circuit device including a phase interpolator, according to embodiments as disclosed herein.

FIG. 2 depicts an integrated circuit device 200 including a phase interpolator 202, according to embodiments as disclosed herein. The integrated circuit device 200 referred herein may be any integrated circuit or an electronic device that includes at least one integrated circuit. The integrated circuit includes the phase interpolator 202 on a feedback path or feedback circuitry. Examples of the integrated circuit device 200 may be, but is not limited to, an integrated circuit including a transceiver, a receiver, a Phase Locked Loop (PLL)/frequency synthesizer, a delay locked loop (DLL) circuit, a clock and data recovery (CDR) circuit, or a high speed interface. In an example embodiment, the integrated circuit device may include a mobile phone, a television, a communication system, radio telephones, or any other device that includes the phase interpolator 202. Examples of the PLL may be, but is not limited to, a Fractional-N type PLL circuit, a Direct Digital Frequency Synthesizer ("DDFS") type PLL, and so on. Examples of the high speed interface may be, but is not limited to, High-Definition Multimedia Interface (HDMI), a display port (DP) and an embedded display port (eDP) system, a peripheral component interconnect express (PCIe) interface, a Universal Serial Bus (USB) interface, and so on. The integrated circuit device 200 may be operated based on timing clock signals and may utilize the phase interpolator 202 for at least one of adjusting sampling of clock signals, frequency tracking, phase tracking, clock recovery, spread spectrum clocking, and so on. For example, the PLL may include the phase interpolator 202 to operate in a fractional mode for providing fine frequency control. For example, the receiver may include the phase interpolator 202 for frequency and phase tracking. For example, the CDR circuit may include the phase interpolator for adjusting data sampling clock to sample data. In an embodiment, the phase interpolator 202 may be implemented to cover a wide range of input frequencies (for example: DC to 4 Giga Hertz (GHz)).

The phase interpolator 202 may be configured to receive multiple input clock phases INPUT_CK from oscillatory circuitry (e.g., VCO 1108 of FIG. 11) present in the integrated circuit device 200 and generate a single output clock phase PI_OUTPUT from the received multiple input clock phases INPUT_CK. In an embodiment herein, the multiple input clock phases INPUT_CK may be input clock signals including different phases, which may be evenly spaced over 360 degrees (360°). For example, the input clock signals INPUT_CK may include at least one of 2 phases, 4 phases, 8 phases, 16 phases, and so on. In an example, the input clock signals with 8 phases may be spaced at 0°, 45°, 90°, 135° 180°, 225°, 270°, 315°, and so on, which are 45° apart from each other. The generated output clock phase PI_OUTPUT may be a clock signal with a single phase that lies between two phases of the multiple input clock phases INPUT_CK. For example, the generated output clock signal PI_OUTPUT may include a phase that lies between the two input clock phases spaced at 0°, and 45°.

The phase interpolator 202 may generate the output clock phase PI_OUTPUT from the multiple input clock phases INPUT_CK using a phase interpolation (PI) code PSC (i.e., a phase selection code or an input selection code). The PI code PSC may be a digital code/data code comprising a plurality of bits and may be generated based on phase resolution of the multiple input clock phases INPUT_CK. The PI code PSC includes a mapping function, which provides information to the phase interpolator 202 to select a number of clock phases from the multiple input clock phases INPUT_CK, and an interpolation function to be applied on the selected input clock phases to generate the output clock phase PI_OUTPUT. Examples of the interpolation function may be, but is not limited to, a linear weighting of the input clock phases, a sinusoidal mapping, and so on.

In an embodiment, the integrated circuit device 200 includes an input controller 204, which may be configured to control the PI code PSC applied to the phase interpolator 202 for ensuring that zero glitches occur at the output clock phase PI_OUTPUT. The input controller 204 generates a delayed PI code PSC_D and provides the delayed PI code PSC_D to the phase interpolator 202 for generating the output clock phase PI_OUTPUT from the multiple clock phases INPUT_CK.

In an embodiment, for generating the delayed PI code PSC_D, the input controller 204 receives the PI code PSC from relevant internal circuitry (e.g., a sigma-delta modulator 1112 of FIG. 11) of the integrated circuit device 200. The input controller 204 generates a delay code CODE_D from a plurality of delay codes by sensing time spacing between the PI code PSC and an input clock of the multiple input clock phases INPUT_CK received from the oscillatory circuit, and predicting if the switching of the PI code PSC causes glitches at the output clock phase PI_OUTPUT. In an embodiment herein, the relative time spacing/phase difference between the PI code PSC and the input clock may correspond to relative edge position of the PI code PSC and the multiple input clock phases of the input clock. Embodiments herein explain determining the time spacing between the PI code PSC and the input clock, by considering three input clock phases of the input clock as an example, but it may be obvious to a person skilled in the art that any number of input clock phases may be considered.

Figure 4A:
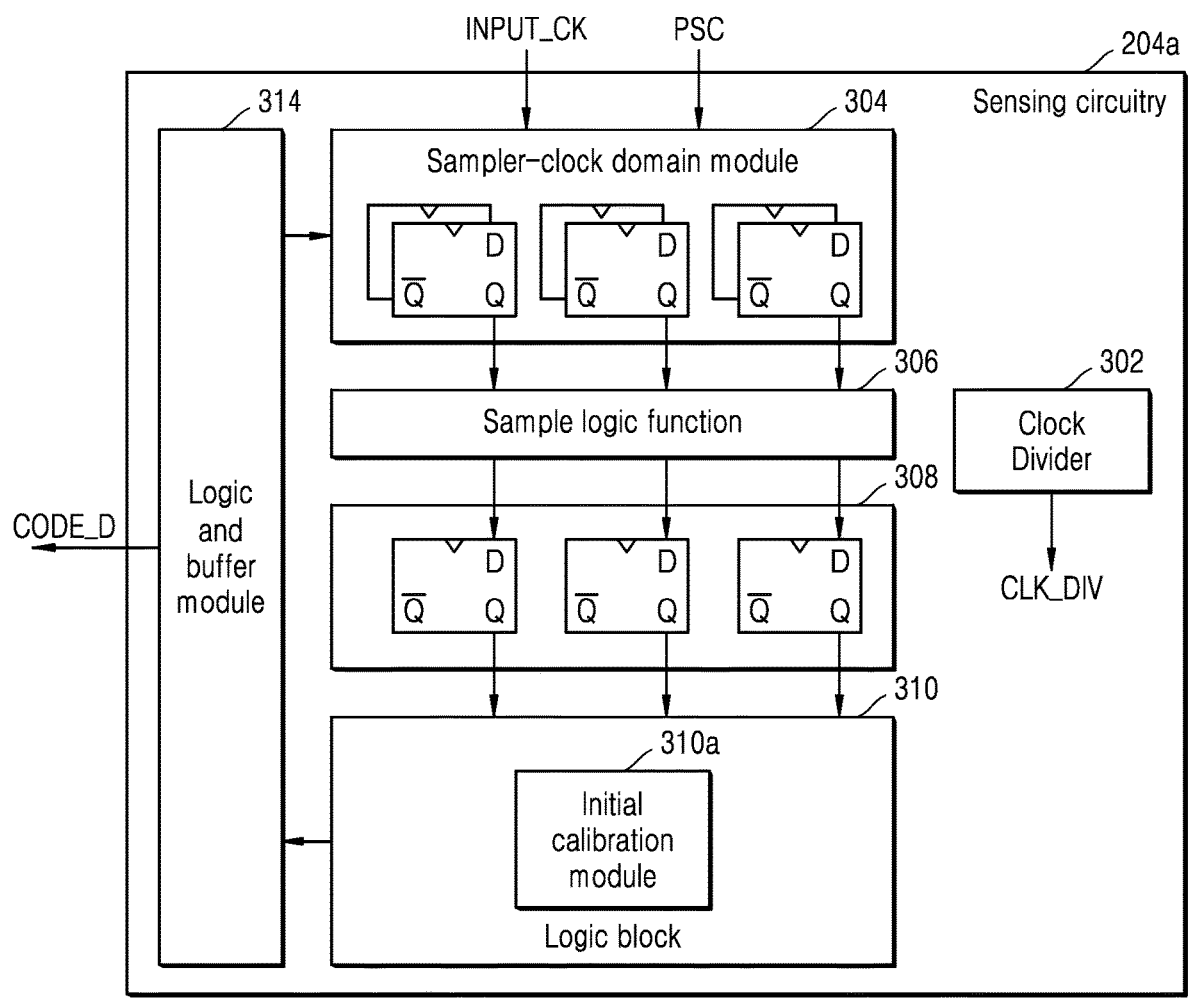
FIGS. 4a and 4b depict the sensing circuitry operating in an initial calibration mode for setting/initializing the delay code, according to embodiments as disclosed herein.

For sensing the time spacing/phase difference between the PI code PSC and the input clock, the PI code PSC is fed to three different samples in a sampler-clock domain module 304 (as depicted in FIG. 4*a*). The three samplers use the PI code PSC as a sampling clock. Data inputs of the three samplers may be connected to the three input clock phases of the input clock and outputs of the three samplers may be the values of the three input clock phases when the PI code PSC performs a transition from a logic low to a logic high. The relative time spacing may be determined between the edge position of PI code PSC and the three input clock phases using the outputs of the three samplers. For example, if the outputs of the three samplers are "000", the rising edge of PI code PSC sampled the logic low value of all the three input clock phases. If the outputs of the three samplers are "011", the rising edge of PI code PSC lies between the rising edges of CLK<0> and CLK<1>. Thus, the outputs of the three samplers provide the relative edge position information between PI code PSC and the three input clock phases. The details of determining the time spacing between the PI code PSC and the input clock is described in conjunction with FIG. 4*a*.

The delay codes are a predefined set of values set based on a design or components or a type of the integrated circuit 200. A range required for the delay codes depends on the variable delay required in the delayed PI code path. Once the range of the delay codes is known and the values of the delay codes in the variable delay element are known, the number of delay codes required is fixed. For example, consider that 16 delay codes are required to generate the variable delay in the delayed PI code path. In such a scenario, the input controller 204 may define the delay codes from 0 to 15 (i.e., 16 delay codes). The input controller 204 may further store the values of the 16 delay codes in registers/memory. In an embodiment, generating the delay code includes fetching one of the delay codes stored in the registers based on the range of the delay codes required for implementing the variable delay in the delayed PI code path.

With the delay codes representing the time spacing between the PI code PSC and the input clock of the multiple input clock phases INPUT_CK, the phase of the input clock may be matched with the phase of the PI code PSC. The input controller 204 adds a variable delay to the PI code PSC, thereby to generate the delayed PI code PSC_D based on the generated delay code CODE_D. In an example embodiment, the input controller 204 may generate the delay code CODE_D for matching the phase of the input clock with the phase of the PI code PSC, generate a variable delay based on the delay code CODE_D, and add the variable delay to the PI code PSC to generate the delayed PI code PSC_D. Further, the phase of the delayed PI code PSC_D is set to a known value with respect to the input clock received from the oscillatory circuit by adding the variable delay to the PI code PSC. Thus, the delayed PI code PSC_D provided as the input to the phase interpolator 202 may have the known phase relationship with respect to the input clock received from the oscillatory circuit, which ensures that switching of the delayed PI code PSC_D occurs in a safe zone by preventing the switching of the delayed PI code PSC_D in an unsafe zone. The safe zone may be a time instant/window of time defined for switching of the delayed PI code PSC_D. The safe zone may be defined as a time window during which the multiple input clock phases INPUT_CK are at the same logic level. The unsafe zone/glitch region may be a time window of time during which the multiple input clock phases INPUT_CK are at different logic levels. Further, the switching of the delayed PI code PSC_D in the safe zone ensures zero glitches and zero meta-stability issues at the output clock phase PI_OUTPUT.

Embodiments herein use the terms such as "PI code", "phase selection code", "input selection code", and so on interchangeably to refer to a code that provides a mapping function to generate the output clock phase PI_OUTPUT. Embodiments herein use the terms such as "delayed PI code", "PI code with delay", "delayed phase selection code", "delayed input selection code", "variable delay circuit output", and so on interchangeably to refer to a PI code with the variable delay that is generated on a PI code generation path and provided to the phase interpolator 202 for generating the output clock phase PI_OUTPUT. Embodiments herein use the terms such as "delay code", "delay selection code", "delay output code", "sensing circuitry output", and so on interchangeably refer to a code CODE_D generated for controlling/varying the delay in the PI code PSC to generate the delayed PI code PSC_D.

The input controller 204 includes sensing circuitry 204*a* for generating the delay code CODE_D and a variable delay circuit 204*b* for generating the delayed PI code PSC_D for the phase interpolator 202.

The sensing circuitry 204*a* may be configured to generate the delay code CODE_D from the plurality of delay codes for the variable delay circuit 204*b* in order to add and vary the delay in the PI code PSC. The delay code CODE_D may be used for matching the phase of the input clock INPUT_CK with the phase of the PI code PSC. In an embodiment herein, the delay code CODE_D may be a binary code corresponding to a value that ranges between 0 and 15. Embodiments herein use the term "delay codes", "delay code values", and so on interchangeably throughout the document.

In an embodiment, the sensing circuitry 204*a* may be configured to initialize/set the delay code CODE_D to at least one value in an initial calibration mode. In the initial calibration mode, the PLL of the integrated circuit device 200 is disabled/not activated. The sensing circuitry 204*a* sets the delay code CODE_D to the at least one value by checking the time spacing (or the phase difference) between the PI code PSC and the input clock INPUT_CK received from the relevant oscillatory circuit and determining if the switching of the PI code PSC is in the safe zone or the unsafe zone. Thus, the sensing circuitry 204*a* may set the delay code CODE_D to at least one value, thereby ensuring that for the initialized delay code value, switching of the PI code PSC occurs in the safe zone. In an embodiment herein, the delay code CODE_D may have the initialized delay code value between 0 and 15. In an example, the initialized delay code value may be 10. The sensing circuitry 204*a* may provide the delay code CODE_D having the initialized/set delay code value to the variable delay circuit 204*b* to generate the delayed PI code PSC_D. Therefore, when the integrated circuit device 200 starts operating, there may be zero glitches and zero meta-stability issues at the output clock phase PI_OUTPUT.

In an embodiment, the sensing circuitry 204*a* may dynamically control the initialized/set delay code CODE_D received from the sensing circuitry 204*a* in a dynamic calibration mode. The dynamic calibration mode may correspond to an activation mode of the PLL of the integrated device circuit 200. In the dynamic calibration mode, factors of the integrated circuit device 200 such as, but not limited to, temperature, voltage drift (VT), supply voltage, temperature, clock frequency, input clock phase rise/fall time, and so on may vary, due to which the switching instant of the PI code PSC may also vary. Therefore, the sensing circuitry 204a may control the initialized/set delay code value of the delay code CODE_D by checking the time spacing between the PI code PSC and the input clock INPUT_CK of the relevant oscillatory circuit and predicting if the switching instant of the PI code PSC is in the safe zone or the unsafe zone in the dynamic calibration mode. In an embodiment, in the dynamic calibration mode, the sensing circuitry 204a may change or retain the initialized delay code value of the delay code CODE_D depending on whether the switching instant of the PI code PSC is in the safe zone or the unsafe zone. For example, the sensing circuitry 204a may change the delay code value from 10 to 12. The sensing circuitry 204a provides the delay code CODE_D determined during the dynamic calibration mode to the variable delay circuit 204b as a control code for adding the delay corresponding to the delay code CODE_D to the PI code PSC.

The variable delay circuit 204b may be configured to generate the delayed PI code PSC_D on receiving the delay code CODE_D from the sensing circuitry 204a, and the PI code PSC from the relevant internal circuitry of the integrated circuit device 200. The variable delay circuit 204b generates a plurality of PI delayed codes PI_CODE_DEL, which will be further described with reference to FIG. 8a, by adding the delay corresponding to the delay code CODE_D to the received PI code PSC. Embodiments herein use the terms such as "PI delayed codes", "intermediary delayed PI codes", "input delayed codes" and so on interchangeably to refer to codes that are generated by adding the variable delay to the PI code PSC. The variable delay circuit 204b selects and interpolates at least two of the PI delayed codes PI_CODE_DEL and generates the delayed PI code PSC_D based on the received delay code CODE_D. In an embodiment, the delayed PI code PSC_D may be present in between the at least two of the PI delayed codes PI_CODE_DEL and may have a known phase relationship with the multiple input clock phases INPUT_CK. The present invention is not limited thereto. In an embodiment, the delayed PI code PSC_D may be the same as at least one of the PI delayed codes PI_CODE_DEL and may have a known phase relationship with the multiple input clock phases INPUT_CK.

The variable delay circuit 204b provides the delayed PI code PSC_D to the phase interpolator 202. The phase interpolator 202 selects at least two of the multiple clock phases INPUT_CK, and interpolates the selected phases using the delayed PI code PSC_D for generating the output clock phase PI_OUTPUT. The delayed PI code PSC_D ensures that the switching of the PI code PSC occurs in the safe zone thereby guaranteeing zero glitches in the output clock phase PI_OUTPUT.

FIG. 2 shows exemplary units of the integrated circuit device 200, but it is to be understood that other embodiments are not limited thereon. In other embodiments, the integrated circuit device 200 may include a smaller or greater number of units. Further, the labels or names of the units are used only for illustrative purpose and do not limit the scope of the embodiments herein. One or more units may be combined together to perform the same or substantially similar function in the integrated circuit device 200.

Figure 3:
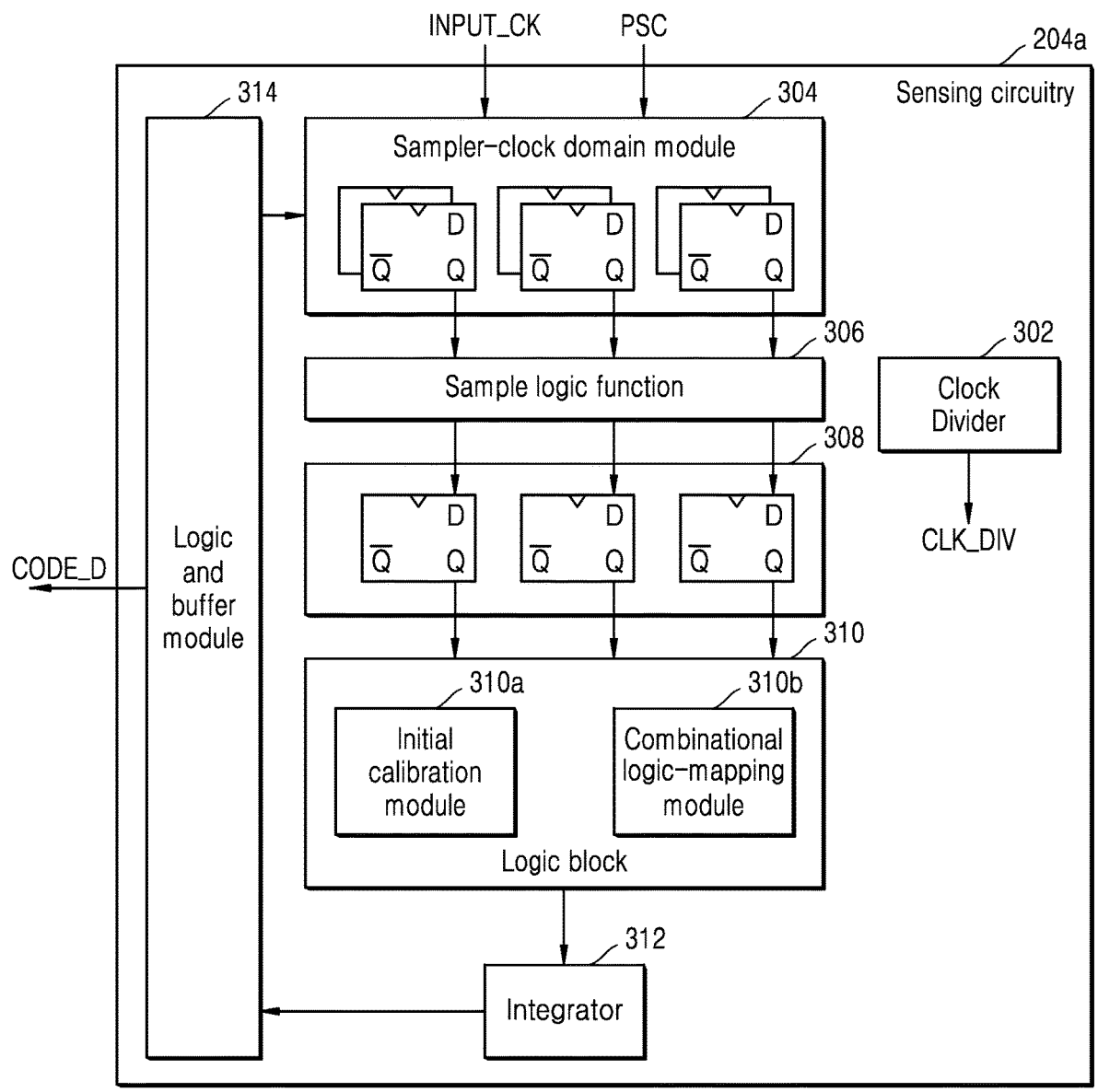
FIG. 3 depicts a sensing circuitry for outputting a delay code, according to embodiments as disclosed herein.

FIG. 3 depicts sensing circuitry 204a (i.e., a sensing circuit) for generating the delay code CODE_D, according to embodiments as disclosed herein. The sensing circuitry 204a includes a clock divider 302, a sampler-clock domain module 304 (i.e., a sampler-clock domain circuit), a sampler logic circuit 306, a sampler-divided clock domain module 308 (i.e., a sampler-divided clock domain circuit), a logic block 310, an integrator 312, and a logic and buffer module 314 (i.e., a logic and buffer circuit). The logic block 310 includes an initial calibration module 310a (i.e., an initial calibration circuit), and a combinational logic mapping module 310b (i.e., a combinational logic mapping circuit).

In an embodiment, in the initial calibration mode, the sensing circuitry 204a may be configured to set/initialize the delay code CODE_D to the at least one value at which switching of the PI code PSC is ensured to occur in the safe zone for the corresponding delay code CODE_D. Due to the setting of the delay code CODE_D in the initial calibration mode, there may be no initial meta-stability or glitches when the integrated circuit device 200 (or the PLL of the integrated circuit device 200) starts to operate. In an embodiment, during the initial calibration mode, the clock divider 302, the sampler-clock domain module 304, the sampler logic circuit 306, the sampler-divided clock domain module 308, and the initial calibration module 310a of the logic block 310 may set/initialize the delay code CODE_D by sensing the phase of the PI code PSC with respect to the clock inputs INPUT_CK and predicting if the switching of the PI code PSC occurs in the safe zone or in the unsafe zone.

In an embodiment, in the dynamic calibration mode, the sensing circuitry 204a may be configured to dynamically control the initialized/set delay code value of the delay code CODE_D to compensate for the change in the switching instant of the PI code PSC due to the change in the factors, such as, but not limited to, temperature, voltage drift (VT), supply voltage, temperature, clock frequency, input clock phase rise/fall time, and so on, of the integrated circuit device 200. In an embodiment, during the dynamic calibration, the clock divider 302, the sampler-clock domain module 304, the sampler logic circuit 306, the sampler-divided clock domain module 308, the combinational logic mapping module 310b of the logic block 310, and the integrator 312 may control the initialized/set delay code value of the delay code CODE_D by predicting if the switching instant of the PI code PSC varies due to the change in the factors of the integrated circuit device 200.

Figure 4B:
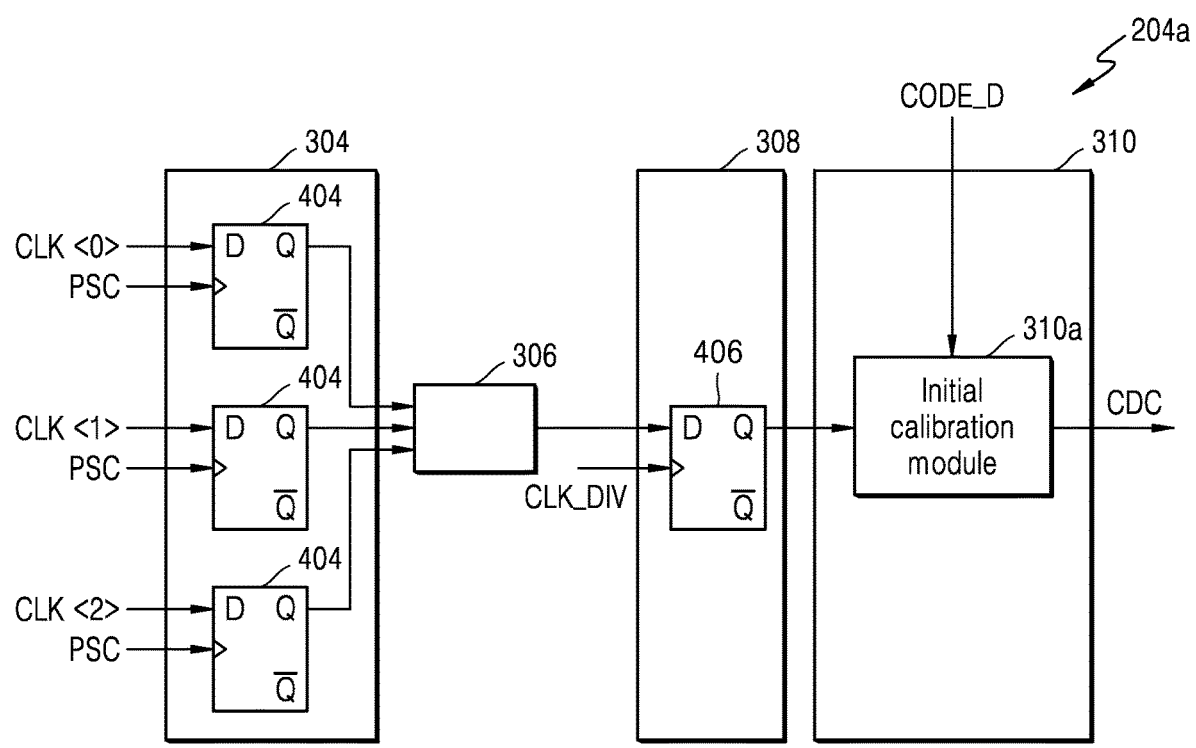

FIGS. 4a and 4b depict the sensing circuitry 204a operating in the initial calibration mode for setting/initializing the delay code CODE_D, according to embodiments as disclosed herein.

In the initial calibration mode, the clock divider 302 may be configured to receive the PI code PSC from the suitable internal circuitry of the integrated circuit device 200, and generate a divided clock signal CLK DIV. The generation of the divided clock signal CLK DIV from the PI code PSC will be described later with reference to FIG. 7b. In an embodiment, the clock divider 302 divides the received PI code PSC to generate the divided clock signal CLK DIV, which may be a low frequency clock signal compared to the received PI code PSC. As both the initial and dynamic calibration modes involve low bandwidth loops, the clock divider 302 generates the divided clock signal CLK DIV as the low frequency clock signal. The other components of the sensing circuitry 204a may operate, based on the divided clock signal CLK DIV, with reduced power consumption, and relaxed timing margins in the calibration mode. The clock divider 302 provides the divided clock signal CLK DIV to the sampler-divided clock domain module 308.

The sampler-clock domain module 304 may be configured to sense the phase relationship between at least one clock input of the clock signal (i.e., the multiple input clock phases INPUT_CK) and the PI code PSC, on receiving the PI code PSC from the internal circuitry of the integrated circuit device 200, and the clock signal from the relevant oscillatory circuit of the integrated circuit device 200. The clock inputs may correspond to phases of the clock signal. In an embodiment, the sampler-clock domain module 304 senses the phase relationship between three clock inputs CLK<0>, CLK<1> and CLK<2> of the clock signal and the PI code PSC. In an example embodiment, the VCO 1108 of FIG. 11 may generate eight clock phases CLK<0> to CLK<7>, which are provided to the sensing circuitry 204a as the input clock phases INPUT_CK, and the sampler-clock domain module 304 senses the phase relationship between three clock inputs CLK<0>, CLK<1> and CLK<2>, and the PI code PSC. The present invention, however, is not limited thereto. The number of the clock inputs may be two, or four or more, and the three clock inputs may be three consecutive clock inputs such as CLK<1>, CLK<2> and CLK<3>. The main constraint is to include all the input clock phases that are associated with the given PI code PSC, however not all the PI codes interact with all the input clock phases. Hereinafter, for the convenience of description, the number of clock inputs are assumed to be three, and the three clock inputs are assumed to be CLK<0>, CLK<1> and CLK<2>.

In an embodiment, the sampler-clock domain module 304 may consider only one PI code PSC of a plurality of PI codes for sensing the phase relationship, as the plurality of PI codes have the same phase relationship path. The plurality of PI codes may be generated by relevant circuitry (for example: a sigma-delta modulator (SDM) 1112) of the integrated circuit 200. The SDM generates the PI codes differently for different use cases. For example, the values of the PI codes may be different for a spread spectrum frequency profile generation compared to a fractional frequency generation. A process of generating the PI code PSC may be intuitively inferred by one of ordinary skill in the art based on a type of the SDM, and thus, its detailed description is omitted. The PI code PSC is a multi-bit signal. The PI code PSC changes at the output of the SDM 1112 to ensure smooth transition from one output phase to another in the phase interpolator 202. The standard methods employed to accomplish the smooth transition of the phase interpolator 202 are limiting change of the PI code PSC to +/−1 and an encoding scheme such that for any code transition, there is only 1 bit transitioning from logic high to low and only 1 bit transitioning from logic low to logic high. In effect, such methods translate the PI code PSC to consecutive bit positions of logic high moving around circularly in the multi-bit PI code.

In an embodiment, the sampler-clock domain module 304 may choose one PI code PSC without considering random mismatch components, as the random mismatch components have smaller magnitude compared to systematic components of the integrated circuit device 200. Thus, considering one of the plurality of PI codes for sensing the phase relationship may reduce requirements of hardware components/resources by taking advantages of the same logic/phase relationship path for all the plurality of PI codes with its corresponding clock inputs (i.e., the multiple input clock phases INPUT_CK).

Embodiments herein are further explained by considering only one PI code and the three clock inputs of the clock signal (i.e., the multiple input clock phases INPUT_CK), but it may be obvious to a person skilled in the art that any number of PI codes, and any number of clock inputs may be considered.

The sampler-clock domain module 304 may also fetch each delay code from the plurality of delay codes from the logic and buffer module 314. The sampler-clock domain module 304 may be configured to, for each delay code, sample the three clock inputs (e.g., CLK<0>, CLK<1> and CLK<2> of the multiple input clock phases INPUT_CK) using the PI code PSC (i.e., using the PI code PSC as a clock signal of a latch or D flip-flop of the sampler-clock domain module 304) and to determine if the switching instant of the PI code PSC is in the safe zone or the unsafe zone at each of the delay codes. The delay codes may be used for matching the phase of the clock inputs with the phase of the PI code PSC. In an embodiment, the delay code CODE_D may be a binary code including the value varying between 0 and 15 (for example, a delay code of 0 (0000)-a delay code of 15 (1111)).

The sampler-clock domain module 304 includes samplers 404 for sampling the clock inputs (i.e., the multiple clock input phases INPUT_CK) as depicted in FIG. 4b. In an embodiment, the sampler 404 may be implemented as a D flip-flop. In an embodiment, the sampler-clock domain module 304 may be associated with the sampler logic circuit 306, and each sampler logic circuit may receive three inputs from three samplers 404. In the initial calibration mode, only three samplers/D flip-flops 404 coupled to sampler logic circuit 306 may operate for sampling the clock inputs (e.g., CLK<0>, CLK<1> and CLK<2> of the multiple input clock phases INPUT_CK). As depicted in FIG. 4b, the sampler-clock domain module 304 fetches a delay code CODE_D from the plurality of delay codes from the logic and buffer module 314. For the fetched delay code CODE_D, the three clock inputs (e.g., CLK<0>, CLK<1> and CLK<2> of the multiple input clock phases INPUT_CK) may be provided to the three D flip-flops 404 as a data input D thereof, and the received PI code PSC is provided as a common clock signal to the three D flip-flops 404. At a rising edge of the clock signal (i.e. switching instance of the PI code PSC from 0 to 1), the three D flip-flops 404 sample the received clock inputs and output sampled values of the three clock inputs. In an example embodiment, the three D flip-flops 404 may sample simultaneously the received clock inputs (e.g., CLK<0>, CLK<1> and CLK<2>) with reference to the rising edge of the clock signal (i.e., the PI code PSC). The sampled values of the three clock inputs may represent a logic level of the three clock inputs at the switching instant of the PI code PSC. The present invention, however, is not limited thereto. In an example embodiment, the switching instant of the PI code PSC may correspond to a falling edge of the PI code PSC.

The sampled values of the three clock inputs may be provided to the sampler logic circuit 306. The sampler logic circuit 306 may be implemented using standard logic gates. A truth table of the sampler logic circuit 306 is depicted in FIG. 5e. The sampler logic circuit 306 may be configured to determine if the sampled values of the three clock signals are the same as each other or not at the switching instant of the PI code PSC. The sampler logic circuit 306 provides an output corresponding to a logic level 0, when the sampled values of the three clock inputs are the same as each other. The output corresponding to the logic level 0 may indicate that switching instant of the PI code PSC is in the safe zone for the fetched delay code CODE_D, as the sampled values of the three clock inputs are the same as each other. The sampler logic circuit 306 provides an output corresponding to logic level 1, when at least one of the sampled values of the three clock inputs is different from the others. The output corresponding to the logic level 1 may indicate that switching of the PI code PSC may occur in the unsafe zone for the fetched delay code CODE_D, as the sampled values of the three clock inputs are not the same as each other. The sampler logic circuit 306 feeds the output to the sampler-divided clock domain module 308.

The sampler-divided clock domain module 308 receives the output of the sampler logic circuit 306 and the divided clock signal CLK_DIV from the clock divider 302, and forwards the output of the sampler logic function 306 to the initial calibration module 310a of the logic block 310. The sampler-divided clock domain module 308 further stores/registers the output of the sampler logic circuit 306. In an embodiment, the sampler-divided clock domain module 308 includes three samplers 406 as depicted in FIG. 4b. The samplers 406 may be implemented as D flip-flops. In the initial calibration mode, one of the three D flip-flops 406 may be operated. As depicted in FIG. 4b, the output of the sampler logic circuit 306 may be provided as the D input of the D flip-flop 406 in the sampler-divided clock domain module 308, and the divided clock signal CLK_DIV may be applied as the clock signal of the D flip-flop 406. The D flip-flop 406 receives the output of the sampler logic circuit 306 at its D input and provides the output of the sampler logic circuit 306 at its output Q. The output of the sampler logic circuit 306 may be provided to the initial calibration module 310a of the logic block 310.

In an embodiment, the initial calibration module 310a may be configured to determine if the switching of the PI code PSC occurs in the safe zone or in the unsafe zone for the fetched delay code CODE_D based on the output of the sampler logic circuit 306. If the output of the sampler logic circuit 306 corresponds to the logic level 0 (indicating that all the sampled values of the three clock signals are at the same logic level), then the initial calibration module 310a determines that the switching instant of the PI code PSC is in the safe region for the fetched delay code CODE_D. The initial calibration module 310a further identifies the associated delay code as a safe delay code, and marks the delay code CODE_D as the safe delay code. In an embodiment, the safe delay code may have a delay code value indicating that the switching instant of the PI code PSC is in the safe zone without causing glitches at the output of the phase interpolator 202. If the output of the sampler logic circuit 306 corresponds to the logic level 1 (indicating that all the sampled values of the three clock signals are not at the same logic level), then the initial calibration module 310a determines that the switching instant of the PI code PSC is in the unsafe region for the fetched delay code CODE_D. The initial calibration module 310a further identifies the associated delay code as an unsafe delay code, and marks the delay code CODE_D as the unsafe delay code. In an embodiment, the unsafe delay code may have a delay code value indicating that the switching instant of the PI code PSC is in the unsafe zone that could result in glitches at the output of the phase interpolator 202. Similarly, the initial calibration module 310a sweeps all the delay codes from the logic and buffer module 314 and determines if the switching instant of the PI code PSC is in the safe zone or the unsafe zone for the swept delay codes using the sampler-clock domain module 304, the sampler logic circuit 306, and the sampler-divided clock domain module 308. The initial calibration module 310a may identify each of the swept delay codes as a safe delay code or an unsafe delay code based on whether the switching instant of the PI code PSC is in the safe zone or unsafe zone for each of the swept delay codes.

After identifying the safe delay codes and the unsafe delay codes among the plurality of delay codes, the initial calibration module 310a determines the safe delay codes that are spaced evenly and consecutively from one another (i.e. a chain/bunch of safe delay codes), and selects a center of the safe delay codes as a center delay code CDC. The center delay code CDC may have the center value of the safe delay codes that has a maximum symmetric margin compared to the other safe delay codes. In an example embodiment, the initial calibration module 310a sets/initializes the selected center of the safe delay codes as the center delay code CDC, thereby ensuring that the switching of the PI code PSC occurs in the safe zone for the center delay code CDC. Consider an example scenario, wherein the values of the safe delay codes ranging 4, 5, 8, 9, 10, 11, and 12 are determined as the safe delay codes. The initial calibration module 310a identifies that the safe delay code values 8, 9, 10, 11, and 12 are spaced evenly and consecutively, and selects/assigns the value 10 as the center delay code CDC, since the safe delay code value 10 may have maximum symmetric margin (+2 or −2) compared to the other delay code values.

In an example embodiment, if the number of safe delay codes is an even number, the initial calibration module 310a selects the center delay code CDC by ensuring that there is a higher margin on a higher side than on a lower side of the safe delay codes. For example, consider that the values of the safe delay codes ranging 9, 10, 11, and 12 are determined as the safe delay codes. In such a scenario, the initial calibration module 310a identifies that the safe delay code values 9, 10, 11, and 12 are spaced evenly and consecutively, and selects/assigns the value 10 as the center delay code CDC, since the safe delay code value 10 may have maximum margin on the higher side than on the lower side of the safe delay codes.

The initial calibration module 310a further provides the set/initialized delay code (i.e., the center delay code CDC) to the logic and buffer module 314 for storage, and to the variable delay circuit 204b for adding an initial delay to the PI code PSC using the center delay code CDC.

FIGS. 5a-5f depict the sensing circuitry 204a operating in the dynamic calibration mode for generating a delay code CODE_D by controlling the center delay code CDC set or initialized by the initial calibration module 310a, according to embodiments as disclosed herein.

In the dynamic calibration mode, the clock divider 302 generates the divided clock CLK_DIV by dividing the received PI code PSC, and provides the divided clock CLK_DIV to the sampler-divided clock domain module 308, the integrator 312, and so on.

Figure 5A:
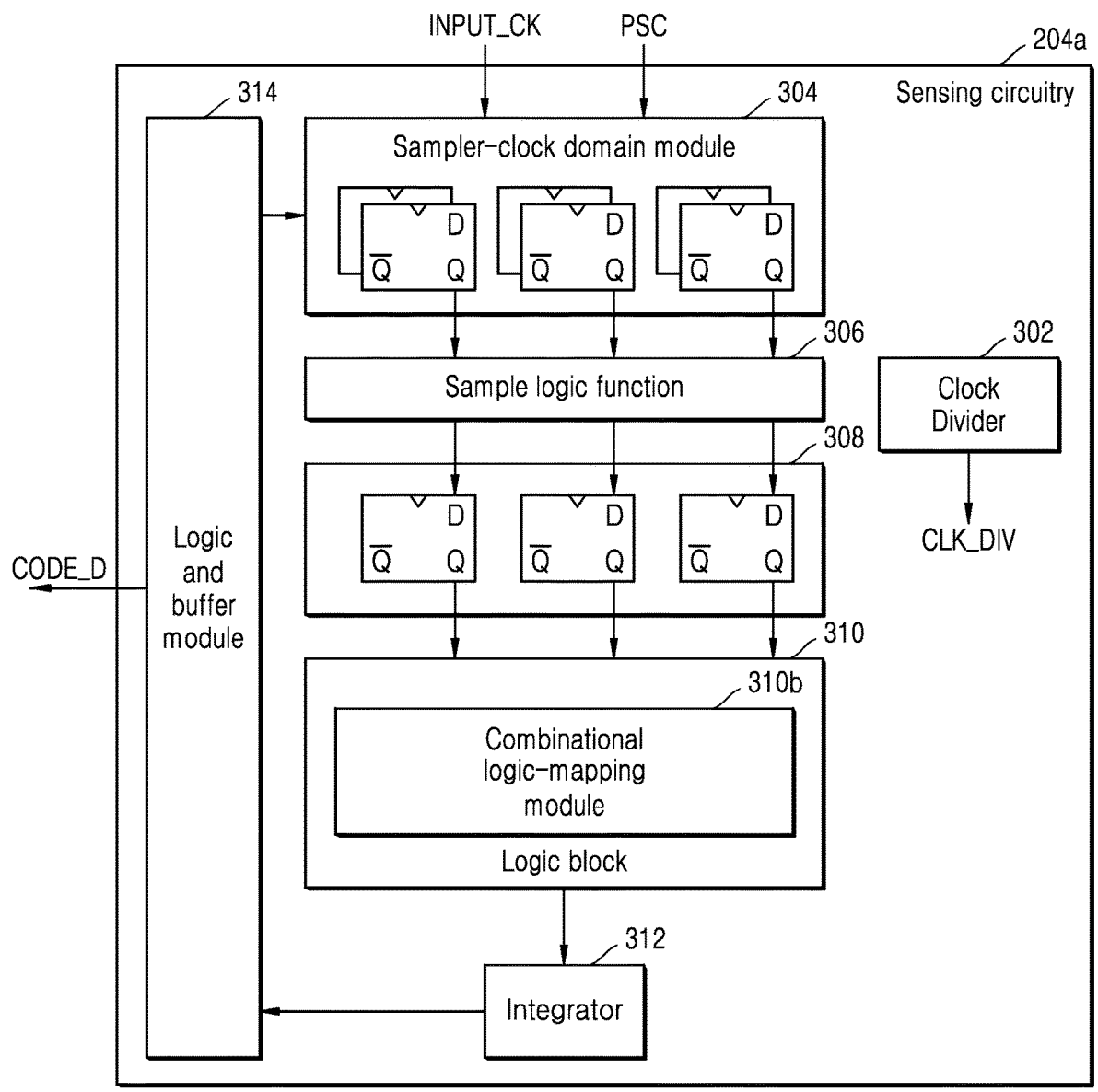
Figure 5B:
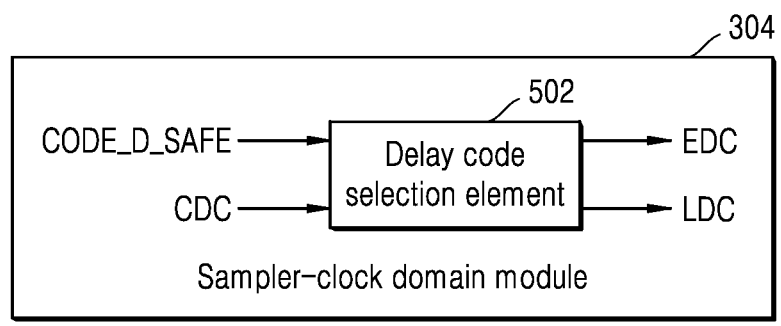

The sampler-clock domain module 304 may be configured to receive the center delay code CDC from the logic and buffer module 314, and determine an early delay code EDC, and a late delay code LDC using the center delay code CDC received from the logic and buffer module 314. As depicted in FIG. 5b, the sampler-clock domain module 304 includes a delay code selection element 502 (i.e., a delay code selection circuit) that may be configured to determine the early delay code EDC, and the late delay code LDC. The delay code selection element 502 identifies the safe delay codes that are advancing/preceding, and delaying/following the center delay code CDC. The delay code selection element 502 determines the safe delay code that is advancing/preceding the center delay code CDC by at least one position as the early delay code EDC. The delay code selection element 502 determines the delay code that is delaying/following the center delay code CDC by at least one position as the late delay code LDC. In an embodiment, the delay code selection element 502 may determine the safe delay code that is advancing the center delay code CDC by two positions (2 positions) as the early delay code EDC. In an embodiment, the delay code selection element 502 may determine the safe delay code that is delaying the center delay code CDC by two positions (2 positions) as the late delay code LDC. Consider an example scenario, wherein a delay code of value 10 among the safe delay codes values 8, 9, 10, 11, and 12 is initialized as the center delay code CDC during the initial calibration. In such a scenario, the delay code selection element 502 determines a delay code of value 8 as the early delay code EDC, as the delay code of value 8 advances the center delay code CDC by two positions. The delay code selection element 502 determines the delay code of value 12 as the late delay code LDC, as the delay code of value 12 delays the center delay code CDC by two positions.

Once the early delay code EDC and the late delay code LDC are generated, the sampler-clock domain module 304 may generate an early PI code PI_CODE_EARLY, a middle/centre PI code PI CODE MID, and a late PI code PI_CODE_LATE on receiving the PI code PSC from the relevant internal circuitry of the integrated circuit device 200. In an embodiment, the received PI code PSC from the relevant internal circuitry of the integrated circuit device 200 does not change by the delay introduced by the variable delay circuit 204b. The variable delay circuit 204b may generate a delay corresponding to any delay code generated by the sampler-clock domain module 304 of the sensing circuitry 204a. In the dynamic calibration mode, the sampler-clock domain module 304 captures the PI code PSC and generates the early PI code PI_CODE_EARLY, the middle/centre PI code PI CODE MID, and the late PI code PI_CODE_LATE from the PI code PSC. In an example embodiment, there may be no difference between the paths on which the PI code PSC is received by the sampler-clock domain module 304 in the initial calibration mode, and the dynamic calibration mode.

Figure 5C:
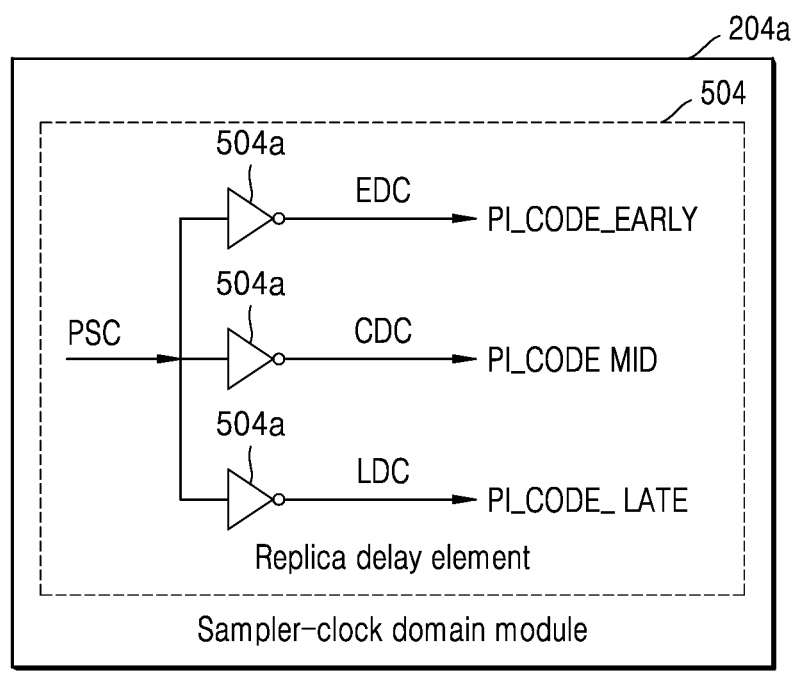

As depicted in FIG. 5c, the sampler-clock domain module 304 may include a replica delay element 504 (i.e., a replica delay circuit) for generating the early PI code PI_CODE_EARLY, the center PI code PI CODE MID, and the late PI code PI_CODE_LATE. The replica delay element 504 may include three buffers 504a. The replica delay element 504 may include three replica instances of the three buffers 504a used in the PI code path. The sampler-clock domain module 304 may feed the received PI code PSC (without delay) to the buffers of the replica delay element 504, and apply the early delay code EDC, the center delay code CDC, and the late delay code LDC to the three buffers 504a, respectively. The buffers 504a of the replica delay element 504 output the early PI code PI_CODE_EARLY, the center PI code PI CODE MID, and the late PI code PI_CODE_LATE, respectively.

After generating the early PI code PI_CODE_EARLY, the center PI code PI_CODE_MID, and the late PI code PI_CODE_LATE, the sampler-clock domain module 304 receives the clock signal (e.g., the multiple input clock phases INPUT_CK) from the relevant oscillatory circuitry of the integrated circuit device 200, and senses the phase relationship between the three clock inputs (e.g., CLK<0>, CLK<1> and CLK<2> of the multiple input clock phases IINPUT_CK) and the early PI code PI_CODE_EARLY, the center PI code PI_CODE_MID, and the late PI code PI_CODE_LATE. The sampler-clock domain module 304 performs the sampling of the clock inputs (e.g., CLK<0>, CLK<1> and CLK<2> of the multiple input clock phases INPUT_CK) using the early PI code PI_CODE_EARLY, the center PI code PI_CODE_MID, and the late PI code PI_CODE_LATE as the clock signals for sampling. The sampling of the sampler-clock domain module will be described with reference to FIG. 5d.

Figure 5D:
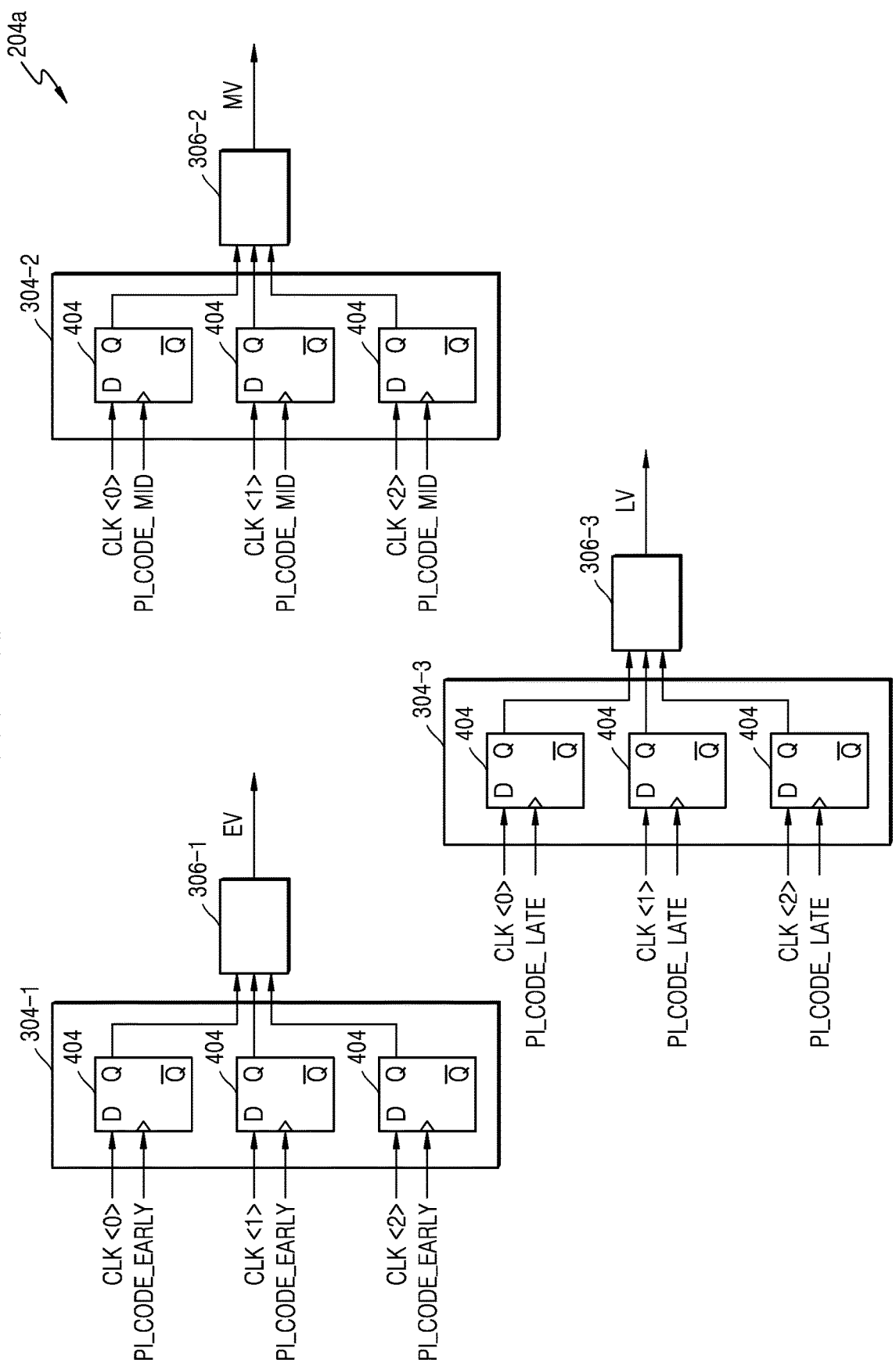

As depicted in FIG. 5d, the sampler-clock domain module 304 may operate the 3×3 samplers/D flip-flops 404 (nine samplers) for sampling of the three clock inputs (e.g., CLK<0>, CLK<1> and CLK<2> of the multiple input clock phases INPUT K). In an example embodiment, the sampler-clock domain module 304 may include a first sampler 304-1, a second sampler 304-2 and a third sampler 304-3. Each of the first to third samplers 304-1 to 304-3 may include three D flip-flops, for example. The first sampler 304-1 may include three D flip-flops 404 and may be operated using the early PI code PI_CODE_EARLY, as a clock signal of the D flip-flops 404 of the first sampler 304-1, corresponding to the early delay code EDC. The second sampler 304-2 may include three D flip-flops 404 and may be operated using the center PI code PI_CODE_MID, as a clock signal of the D flip-flops 404 of the second sampler 304-2, corresponding to the center delay code CDC. The third sampler 304-3 may include three D flip-flops 404 and may be operated using the late PI code PI_CODE_LATE, as a clock signal of the D flip-flops 404 of the third sampler 304-3, corresponding to the late delay code LDC. Each of the first, second, and third samplers 304-1 to 304-3 may include three D flip-flops, for example.

The sampler-clock domain module 304 may apply the three clock inputs (e.g., CLK<0>, CLK<1> and CLK<2> of the multiple input clock phases INPUT_CK received from the relevant oscillatory circuitry of the integrated circuit device 200) as data inputs to the first sampler 304-1, and the early PI code PI_CODE_EARLY as a clock signal to each of the three D flip-flops 404 of the first sampler 304-1. The D flip-flops 404 of the first sampler 304-1 output the sampled values of the three clock inputs at the rising edge of the early PI code PI_CODE_EARLY. The sampled values may indicate the logic level of the three clock inputs at the rising edge of the early PI code PI_CODE_EARLY. The first D flip-flops 404 of the first sampler 304-1 provide the sampled values of the three clock inputs with respect to the early PI code PI_CODE_EARLY to the sampler logic circuit 306.

The sampler-clock domain module 304 may apply the three clock inputs as data inputs to the second sampler 304-2 having three D flip-flops 404, and the center PI code PI_CODE_MID corresponding to the center delay code CDC as the clock signals to the D flip-flops 404 of the second sampler 304-2. The D flip-flops 404 of the second sampler 304-2 output the sampled values of the three clock inputs (e.g., CLK<0>, CLK<1> and CLK<2> of the multiple input clock phases INPUT_CK) at the rising edge of the center PI code PI_CODE_MID. The sampled values may indicate the logic level of the three clock inputs at the rising edge of the center PI code PI_CODE_MID. The second D flip-flops 404 of the second sampler 304-2 provide the sampled value of the three clock signals with respect to the center PI code PI_CODE_MID to the sampler logic circuit 306.

The sampler-clock domain module 304 may apply the three clock inputs as data inputs to the third sampler 304-3 having three D flip-flops 404, and the late PI code PI_CODE_LATE corresponding to the late delay code LDC as the clock signals to the D flip-flops 404 of the third sampler 304-3. The D flip-flops 404 of the third sampler 304-3 output the sampled values of the three clock inputs at the rising edge of the late PI code PI_CODE_LATE. The sampled values may indicate the logic level of the three clock inputs at the rising edge of the late PI code PI_CODE_LATE. The D flip-flops 404 of the third sampler 304-3 provide the sampled value of the three clock inputs with respect to the late PI code PI_CODE_LATE to the sampler logic circuit 306.

The sampler logic circuit 306 may include a first sampler logic circuit 306-1, a second sampler logic circuit 306-2 and a third sampler logic circuit 306-3. The sampler logic circuit may be implemented using standard logic gates. The truth table of the sampler logic circuit 306 is depicted in FIG. 5e. The first to third sampler logic circuits 306-1 to 306-3 may be configured to output an early value EV, a middle value MV, and a late value LV by performing a logic operation on the sampled values of the three clock inputs with respect to the early PI code PI_CODE_EARLY, the center PI code PI_CODE_MID, and the late PI code PI_CODE_LATE, respectively. As depicted in FIG. 5d, the first sampler logic circuit 306-1 receives the sampled values of the three clock signals from the first sampler 304-1 corresponding to the early PI code PI_CODE_EARLY, and outputs the early value EV. The early value EV may correspond to the logic level 0 or logic level 1. The first sampler logic circuit 306-1 may output the early value EV corresponding to the logic level 0 if the sampled values of the three clock inputs are the same as each other at the rising edge of the early PI code PI_CODE_EARLY. The early value EV corresponding to the logic level 0 indicates that the switching instant of the PI code PSC is in the safe zone (with zero glitches at the output clock phase PI_OUTPUT) for the early delay code EDC. The first sampler logic circuit 306-1 may output the early value EV of the logic level 1, if the sampled values of the three clock inputs are not same as each other at the rising edge of the early PI code PI_CODE_EARLY. The early value EV of the logic level 1 indicates that the switching instant of the PI code PSC is in the unsafe zone causing glitches at the output clock phase PI_OUTPUT for the early delay code EDC.

As depicted in FIG. 5d, the second sampler logic circuit 306-2 receives the sampled values of the three clock inputs from the second sampler 304-2 corresponding to the center PI code PI_CODE_MID, and outputs the middle value MV. The middle value may correspond to the logic level 0 or logic level 1. The second sampler logic circuit 306-2 may output the middle value MV corresponding to the logic level 0, if the sampled values of the three clock inputs are the same as each other at the rising edge of the center PI code PI_CODE_MID. The middle value MV of the logic level 0 indicates that the switching of the PI code PSC occurs in the safe zone with zero glitches at the output clock phase PI_OUTPUT for the center delay code CDC. The second sampler logic circuit 306-2 may output the middle value MV corresponding to the logic level 1 if the sampled values of the three clock inputs are not same as each other at the rising edge of the center PI code PI_CODE_MID. The middle value MV of the logic level 1 indicates that the switching instant of the PI code PSC is in the unsafe zone by causing glitches at the output clock phase PI_OUTPUT for the center delay code PI_CODE_MID.

As depicted in FIG. 5d, the third sampler logic circuit 306-3 receives the sampling values of the three clock inputs from the D flip-flops 404 of the third sampler 304-3 corresponding to the late PI code PI_CODE_LATE, and outputs the late value LV. The late value LV may correspond to the logic level 0 or logic level 1. The third sampler logic circuit 306-3 may output the late value LV including the logic level 0 if the sampled values of the three clock inputs are the same as each other at the rising edge of the late PI code PI_CODE_LATE. The late value LV of the logic level 0 indicates that the switching of the PI code PSC occurs in the safe zone with zero glitches in the output clock phase PI_OUTPUT for the late delay code LDC. The third sampler logic circuit 306-3 may output the late value LV of the logic level 1 if the sampled values of the three clock inputs are not the same as each other at the rising edge of the late PI code PI_CODE_LATE. The lave value LV of the logic level 0 indicates that the switching of the PI code PSC occurs in the unsafe zone by causing glitches at the output clock phase PI_OUTPUT for the late delay code LDC. The first to third sampler logic circuits 306-1 to 306-3 provide the early value EV, the middle value MV, and the late value LV to the sampler-divided clock domain module 308, respectively.

Figure 5F:
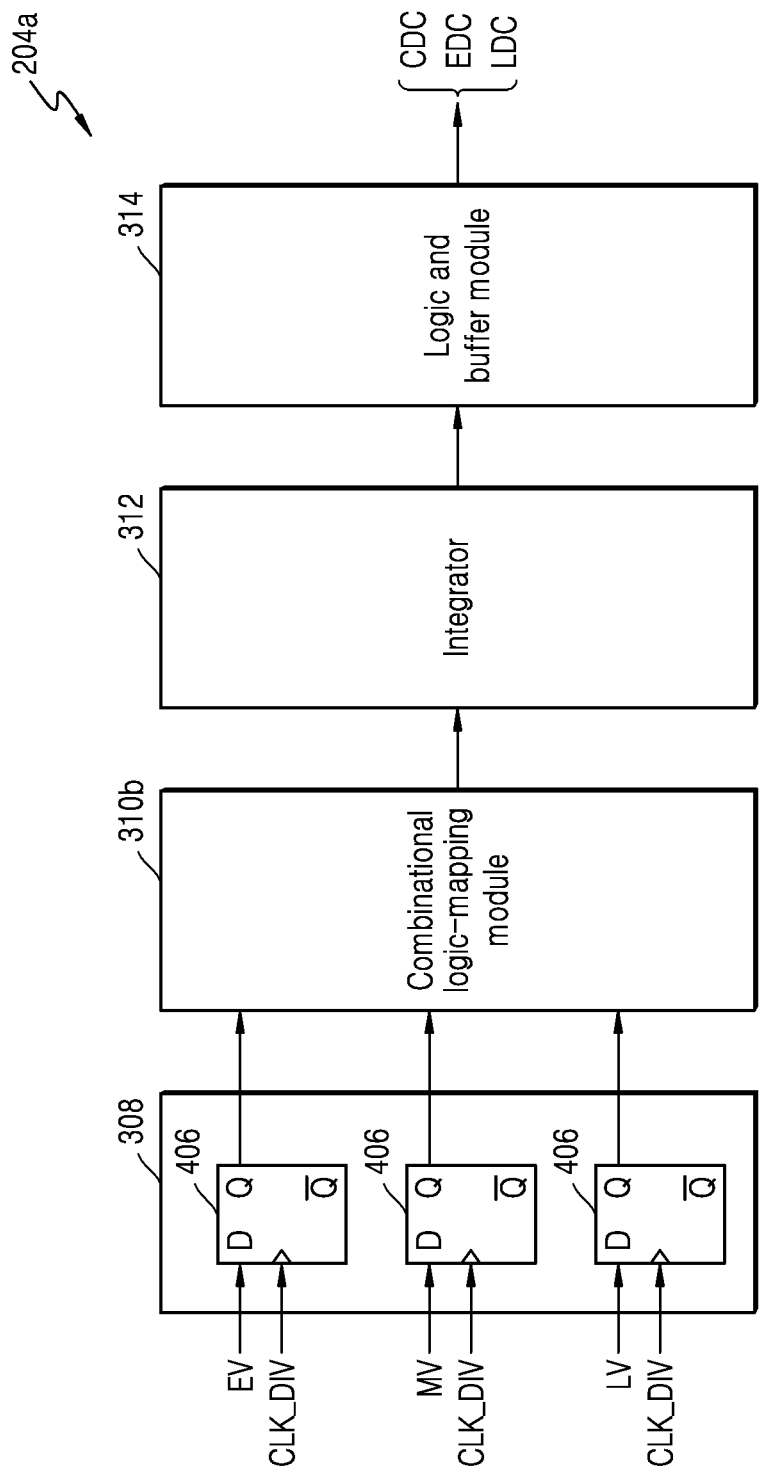

The sampler-divided clock domain module 308 receives the early value EV, the middle value MV, and the late value LV of the first to third sampler logic circuits 306-1 to 306-3, and the divided clock signal CLK_DIV from the clock divider 302. The sampler-divided clock domain module 308 forwards the early value EV, the mid value MV, and the late value LV to the combinational logic mapping module 310b of the logic block 310. The sampler-divided clock domain module 308 further stores/registers the early value EV, the middle value MV, and the late value LV of the sampler logic circuit 306. As depicted in FIG. 5f, the early value EV, the middle value MV, and the late value LV of the sampler logic circuit 306 are provided to the D flip-flops 406 of the sampler-divided clock domain module 308 as D-inputs of the D flip-flops 406 and the divided clock signal CLK_DIV is applied to the three flip-flops 406 as the common clock signal of the D flip-flops 406 of the sampler-divided clock domain module 308. The D flip-flops 406 of the sampler-divided clock domain module 308 forward the early value EV, the middle value MV, and the late value LV at their outputs Q, respectively. The early value EV, the middle value MV, and the late value LV present at the outputs Q of the D flip-flops 406 may be forwarded to the combinational logic mapping module 310b of the logic block 310.

The combinational logic mapping module 310b may be configured to receive the early value EV, the middle value MV, and the late value LV of the sampler logic circuit 306 through the sampler-divided clock domain module 308 and generate a decision output which is provided to the integrator 312. A decision output of the combinational logic mapping module 310b may include information about how to control/change the set/initialized delay code (i.e., the center delay code CDC generated from the initial calibration module 310a). The decision output may correspond to '0', or '1', or '−1'. The decision output corresponding to '0' may indicate that the set/initialized delay code (i.e., the center delay code CDC) may be retained without any changes. The decision output corresponding to '1' may indicate that the set/initialized delay code (i.e., the center delay code CDC) may be moved/changed towards the late delay code LDC by increasing the center delay code CDC by 1. The decision output corresponding to '−1' may indicate that the set/initialized delay code (i.e., the center delay code CDC) may be moved/changed towards the early delay code EDC by decreasing the center delay code CDC by 1. For instance, consider herein that the early delay code EDC may be 8, the center delay code CDC may be 10, and the late delay code LDC may be 12. In such a case, the decision output of the value +1 may indicate that the center delay code CDC generated from the initial calibration module 310a is moved towards the late delay code LDC by increasing the center delay code CDC by 1 so that the center delay code CDC is moved to 11. The decision output of value 0 may indicate that the center delay code CDC generated from the initial calibration module 310a is retained. The decision output of value −1 may indicate that the center delay code CDC generated from the initial calibration module 310a is moved towards the early delay code EDC by decreasing the center delay code CDC by 1 so that the center delay CDC is moved to 9.

The combinational logic mapping module 310b may generate the decision output using a logic-mapping table/combinational-logic table. In an embodiment, the combinational logic mapping module 310b may maintain the logic-mapping table, which includes a mapping relationship between the decision outputs and the early value EV, the middle value MV, and the late value LV of the sampler logic circuit 306. The combinational logic mapping module 310b uses the logic-mapping table and determines an early value, a middle value, and a late value present in the logic-mapping table that are matched with the early value EV, the middle value MV, and the late value LV of the sampler logic circuit 306. The combinational logic mapping module 310b selects the decision output mapped with the determined early value, the determined middle value, and the determined late value of the logic-mapping table as the decision output for the early value EV, the middle value MV, and the late value LV of the sampler logic circuit 306. Consider an example, wherein the sampler logic circuit 306 outputs the early value EV as '0', the middle value MV as '0', and the late value LV as '0', which indicates that the switching of the PI code PSC does not result in the glitches at the output clock phase PI_OUTPUT for the early delay code EDC, the center delay code CDC and the late delay code LDC. In such a case, the combinational logic mapping module 310b uses the logic-mapping table and generates the decision output as '0'. The decision output '0' indicates that initialized/set delay code (the center delay code CDC) generated from the initial calibration module 310a may be retained, since there in no glitch at the output clock phase PI_OUTPUT associated with any of the delay codes (the early delay code EDC, the center delay code CDC and the late delay code LDC). Thus, the decision output 0 may instruct the integrator 312 to follow expected steady state condition (no change is required for the center delay code CDC generated from the initial calibration module 310a).

Consider an example scenario, wherein the sampler logic circuit 306 outputs the early value EV as '0', the middle value MV as '0', and the late value LV as '1', which indicate that the switching of the PI code PSC may not cause any glitches at the output clock phase PI_OUTPUT for the early delay code EDC, and the center delay code CDC and the switching of the PI code PSC may cause a glitch at the output clock phase PI_OUTPUT for the late delay code LDC. In such a case, the combinational logic mapping module 310b uses the logic-mapping table and generates the decision output as '−1'. The decision output '−1' indicates that initialized/set delay code (i.e., the center delay code CDC) generated from the initial calibration module 310a is moved/changed towards the early delay code EDC by decreasing the center delay code CDC by 1. Thus, the switching of the PI code PSC is ensured to occur in the safe zone without causing glitches at the output clock phase PI_OUTPUT, even if the delay of the variable delay circuit 204b may increase taking the delay corresponding to the center delay code CDC closer to the late delay code LDC.

Consider an example, wherein the sampler logic circuit 206 outputs the early value EV as '0', the middle value MV as '1', and the late value LV as '0'. The outputs of the sampler logic circuit 306 indicate that the switching of the PI code PSC does not cause glitches at the output clock phase PI_OUTPUT for the early delay code EDC, and the late delay code LDC and the switching of the PI code PSC may cause a glitch at the output clock phase PI_OUTPUT for the center delay code CDC. In such a case, the combinational logic mapping module 310b uses the logic-mapping table and generates the decision output to move/change the center delay code CDC generated from the initial calibration module 310a to either the early delay code EDC or the late delay code LDC. In an example herein, consider that the combinational logic mapping module 310b may generate the decision output '+1' indicating that initialized/set delay code (i.e., the center delay code CDC) is moved/changed towards the late delay code LDC by increasing the center delay code CDC by 1, in order to ensure that the switching of the PI code PSC occurs in the safe zone without causing any glitch at the output clock phase PI_OUTPUT.

Consider an example, wherein the sampler logic circuit 306 outputs the early value EV as '1', the middle value MV as '0', and the late value LV as '0'. The outputs of the sampler logic circuit 306 indicate that the switching of the PI code PSC does not cause any glitches at the output clock phase PI_OUTPUT for the center delay code CDC and the late delay code LDC, and the switching of the PI code PSC may cause a glitch at the output clock phase PI_OUTPUT for the early delay code EDC. In such a case, the combinational logic mapping module 310b uses the logic-mapping table and generates the decision output as '+1'. The decision output '+1' indicates that initialized/set delay code (i.e., the center delay code CDC) generated from the initial calibration module 310a is moved/changed towards the late delay code LDC by increasing the center delay code CDC, in order to ensure that the switching of the PI code PSC occurs in the safe zone without causing any glitches at the output clock phase PI_OUTPUT of the phase interpolator 202.

The integrator 312 may be configured to provide an integrated output based on the decision outputs of the combinational logic mapping module 310b. The integrated output may be a decimal value. In an embodiment, the integrator 312 may be configured to collect and accumulate the decision outputs from the combinational logic mapping module 310b. The integrator 312 performs an integration operation on the decision outputs to generate the integrated output. The integrated output may indicate the decimal value corresponding to the decision outputs generated by the combinational logic mapping module 310b. In an embodiment, the integrated output may be a cumulative decision output of the decision outputs generated by the combinational logic mapping module 310b. Thus, the integrated output generated by the integrator 312 represents a cumulative shift required on the initialized delay code (i.e., the center delay code CDC generated from the initial calibration module 310a). The integrator 312 feeds the integrated output/decimal value corresponding to the decision outputs to the logic and buffer module 314.

The logic and buffer module 314 may be configured to generate the delay code CODE_D using the integrated output/decimal value and the initialized center delay code. The logic and buffer module 314 decodes the decimal value into a binary code based on the sign of the decimal value and adds the binary code to the initialized delay code (i.e., the center delay code CDC generated from the initial calibration module 310a). Thus, the delay code CODE_D generated during the dynamic calibration mode may be the initialized delay code added with the binary code which corresponds to the decimal value generated by the integrator 312. In an example embodiment, the delay code CODE_D generated from the logic and buffer module 314 may correspond to the initialized delay code (i.e., the center delay code CDC generated from the initial calibration module 310a), if the decimal value generated by the integrator 312 is 0. In an example, the delay code CODE_D generated from the logic and buffer module 314 may correspond to the sum of the initialized delay code (i.e., the center delay code CDC generated from the initial calibration module 310a) and −1, if the decimal value generated by the integrator 312 is −1. In an example embodiment, the delay code CODE_D of the logic and buffer module 314 may correspond to a sum of the initialized delay code (i.e., the center delay code CDC generated from the initial calibration module 310a) and 1, if the decimal value generated by the integrator 312 is 1.

In an embodiment, when the initialized delay code (i.e., the center delay code CDC generated from the initial calibration module 310a) overflows or underflows with the addition of the binary code (corresponding to the integrator output), the logic and buffer module 314 performs a modulo operation on a value resulting from adding the binary code corresponding to the decimal value of the integrator 312 to the initialized delay code (i.e., the center delay code CDC generated from the initial calibration module 310a). Consider an example scenario, wherein during the initial calibration mode, a delay code 15 (a delay code of 1111) from 16 delay codes (delay code of 0000-delay code of 1111) is initialized as the center delay code CDC. During a dynamic calibration mode, the integrator 312 outputs the decimal value of +1 that is added by the logic and buffer module 314 to the initialized delay code (i.e., the center delay code CDC having a value of 15 generated from the initial calibration module 310a). If the logic and buffer module 314 adds +1 to the delay code 15, the delay code resulting from the addition may overflow. In such a scenario, the logic and buffer module 314 performs a modulo addition operation (for example, a modulo 16 addition) on a value resulting from adding the decimal value of +1 to the delay code 15, so that the delay code CODE_D repeats from the delay code of 0 in a fresh manner. Consider another example scenario, wherein during the initial calibration mode, a delay code 0 (a delay code (0000)) from 16 delay codes (delay code (0000)-delay code (1111)) is initialized as the center delay code CDC generated from the initial calibration module 310a. During a dynamic calibration mode, the integrator 312 outputs the decimal value of −1 that is added by the logic and buffer module 314 to the initialized delay code (i.e., the center delay code of 0). If the logic and buffer module 314 adds −1 to the delay code 0, the delay code resulting from the addition may underflow. In such a scenario, the logic and buffer module 314 performs a modulo addition operation (for example, a modulo 16 addition) on a value resulting from adding the decimal value of −1 to the delay code 0, so that the delay code CODE_D has the delay code of 15 in a fresh manner.

The logic and buffer module 314 stores the delay code CODE_D, and provides the generated delay code CODE_D to the variable delay circuit 204b for generating the delayed PI code PSC_D.

FIGS. 3-5e show exemplary units/components of the sensing circuitry 204a, but it is to be understood that other embodiments are not limited thereon. In other embodiments, the sensing circuitry 204a may include a smaller or greater number of units. Further, the labels or names of the units are used only for illustrative purpose and does not limit the scope of the embodiments herein. One or more units may be combined together to perform same or substantially similar function in the sensing circuitry 204a.

FIG. 6 depicts the logic-mapping table used to generate the decision output, according to embodiments as disclosed herein. The logic-mapping table includes mapping of the decision outputs with a combination of the early value EV, the middle value EV, and the late value of the sampler logic circuit 306.

The decision output '0' may be generated, when the early value EV is '0', the middle value MD is '0', and the late value LV is '0'. The decision output '0' indicates that the initialized delay code (i.e., the center delay code CDC generated from the initial calibration module 310a) may be retained due to the expected steady conditions. The decision output '−1' may be generated, when the early value EV is '0', the middle value is '0', and the late value LV is '1'. The decision output '−1' indicates that the initialized delay code (i.e., the center delay code CDC generated from the initial calibration module 310a) is changed towards the early delay code EDC by decreasing the center delay code CDC by 1. The decision output '1' may be generated, when the early value EV is '0', the middle value MV is '1', and the late value LV is '0'. The decision output '+1' indicates that the initialized delay code (i.e., the center delay code CDC generated from the initial calibration module 310a) is changed towards the late delay code LDC.

The decision output '−1' may be generated, when the early value EV is '0', the middle value MV is '1', and the late value LV is '1'. In such a case, the decision output '-1' indicates that the initialized delay code (i.e., the center delay code CDC generated from the initial calibration module 310a) is changed towards the early delay code EDC by decreasing the center delay code CDC by 1. Changing of the initialized delay code towards the early delay code EDC involves changing the logic state output of the early delay code EDC, the center delay code CDC and the late delay code LDC from "011" to "001" by moving "011" towards the steady state condition of "000" by 1. The switching of the PI code PSC corresponding to a combination of the early value EV, the middle value MV and the late value LV may occur in safe zones. The decision output '1' may be generated, when the early value EV is '1', the middle value MV is '0', and the late value LV is '0'. In such a case, the decision output '1' indicates that the initialized delay code is changed towards the late delay code LDC. The decision output '0' may be generated, when the early value EV is '1', the middle value MV is '0', and the late value LV is '1'. In such a case, the decision output '0' indicates that the initialized delay code (i.e., the center delay code CDC generated from the initial calibration module 310a) may be retained without any changes. The decision output '1' may be generated, when the early value EV is '1', the middle value MV is '1', and the late value LV is '0'. In such a case, the decision output '1' indicates that the initialized delay code (i.e., the center delay code CDC generated from the initial calibration module 310a) is changed towards the late delay code LDC by increasing the center delay code CDC by 1. Changing of the initialized delay code towards the early delay code EDC involves changing the logic state output of the early delay code EDC, the center code CDC and the late code LDC from "110" to "100" by moving "110" towards the steady state condition of "000" by 1. The switching of the PI code PSC corresponding to a combination of the early value EV, the middle value MV and the late value LV may occur in the safe zones.

The decision output '1' may be generated, when the early value EV is '1', the middle value MV is '1', and the late value LV is '1'. In such a case, the decision output '1' indicates that the initialized delay code (i.e., the center delay code CDC generated from the initial calibration module 310a) is changed towards the late delay code LDC to drive the output decisively in one direction.

Figure 7A:
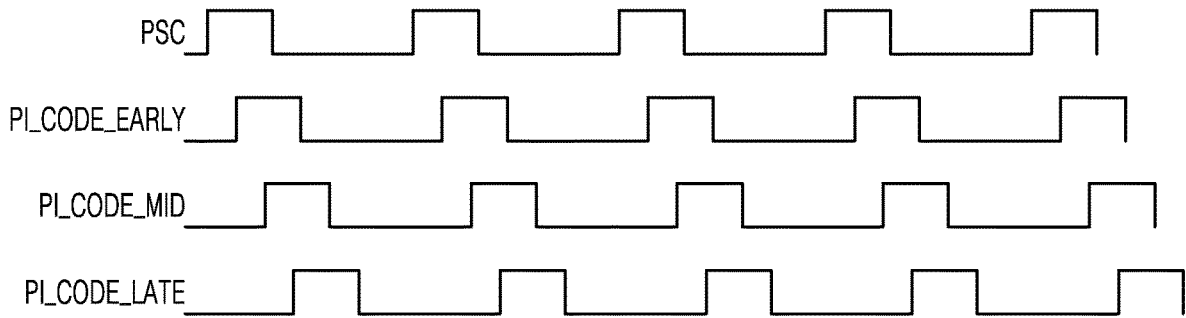
FIG. 7a is a timing diagram depicting an early Phase Interpolation (PI) code, a middle PI code, and a late PI code, according to embodiments as disclosed herein.

FIG. 7a is a timing diagram depicting the early PI code PI_CODE_EARLY, the center PI code PI_CODE_MID, and the late PI code PI_CODE_LATE, according to embodiments as disclosed herein. Embodiments herein enable the replica delay element 504 of the sampler-clock domain module 304 to generate the early PI code PI_CODE_EARLY, the center PI code PI_CODE_MID, and the late PI code PI_CODE_LATE using the three buffers 504a. The same PI code PSC may be applied to the three buffers 504a, and the early delay code EDC, the center delay code CDC, and the late delay code LDC may be applied to three buffers 504a respectively. The three buffers 504a generate the early PI code PI_CODE_EARLY, the center PI code PI_CODE_MID, and the late PI code PI_CODE_LATE form the PI code PSC. Example timing waveforms of the PI code PSC, the early PI code PI_CODE_EARLY, the center PI code PI_CODE_MID, and the late PI code PI_CODE_LATE, are depicted in FIG. 7a.

Figure 7B:
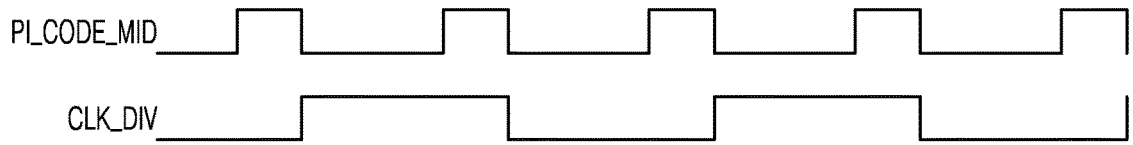
FIG. 7b depicts timing waveforms corresponding to the middle PI code, and a divided clock signal, according to embodiments as disclosed herein.

FIG. 7b depicts timing waveforms corresponding to the center PI code PI_CODE_MID, and the divided clock signal CLK_DIV, according to embodiments as disclosed herein. An example timing waveform of the center PI code PI_CODE_MID is depicted in FIG. 7b. At the rising edge of the center PI code PI_CODE_MID, the clock inputs (i.e., the multiple input clock phases INPUT_CK) may be sampled and applied to the sampler logic circuit 306 (e.g., the second sampler logic circuit 306-2) for checking if the switching of the center PI code PI_CODE_MID occurs in the safe zone or the unsafe zone. An example timing waveform of the divided clock signal CLK_DIV is depicted in FIG. 7b. In an example embodiment, the divided clock signal CLK_DIV may be generated from the PI code PSC or one of the early PI code PI_CODE_EARLY, the center PI code PI_CODE_MID and the late PI code PI_CODE_LATE generated from the PI code PSC. For example, the divided clock signal CLK_DIV is generated from the center PI code PI_CODE_MID. The divided clock signal CLK_DIV has a frequency lower than that of the center PI code PI_CODE_MID. In an example, at a first rising edge of the divided clock signal CLK_DIV, the sampler-divided clock domain module 308 samples and forwards, in response to the divided clock signal CLK_DIV, the output of the sampler logic circuit 306 to the combinational logic mapping module 310b to generate the decision output. At a second rising edge of the divided clock signal, the integrator 312 may initiate the integration operation on the decision outputs of the combinational logic mapping module 310b to provide the decimal/integrated value.

Figure 8A:
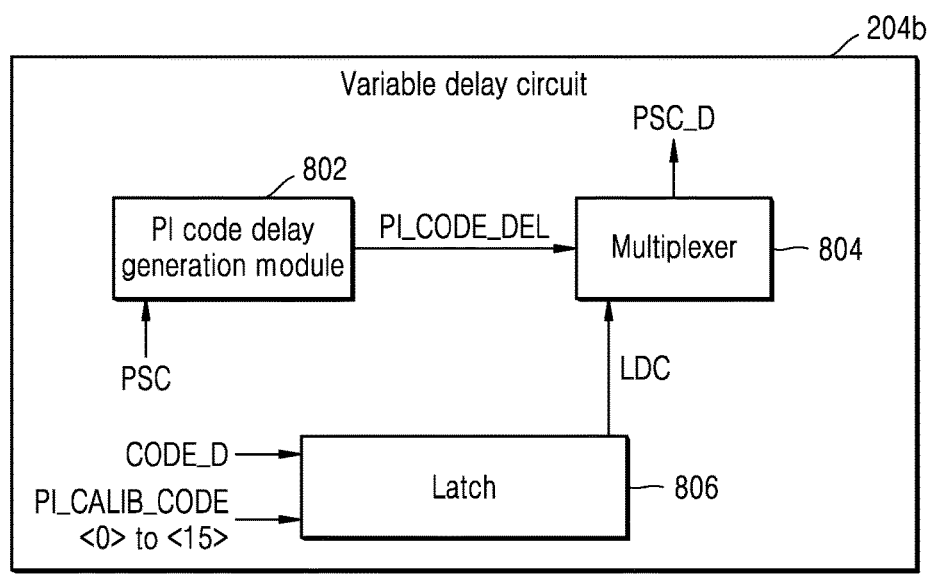
FIGS. 8a and 8b depict a variable delay circuit for generating a delayed PI code, according to embodiments as disclosed herein.
Figure 8B:
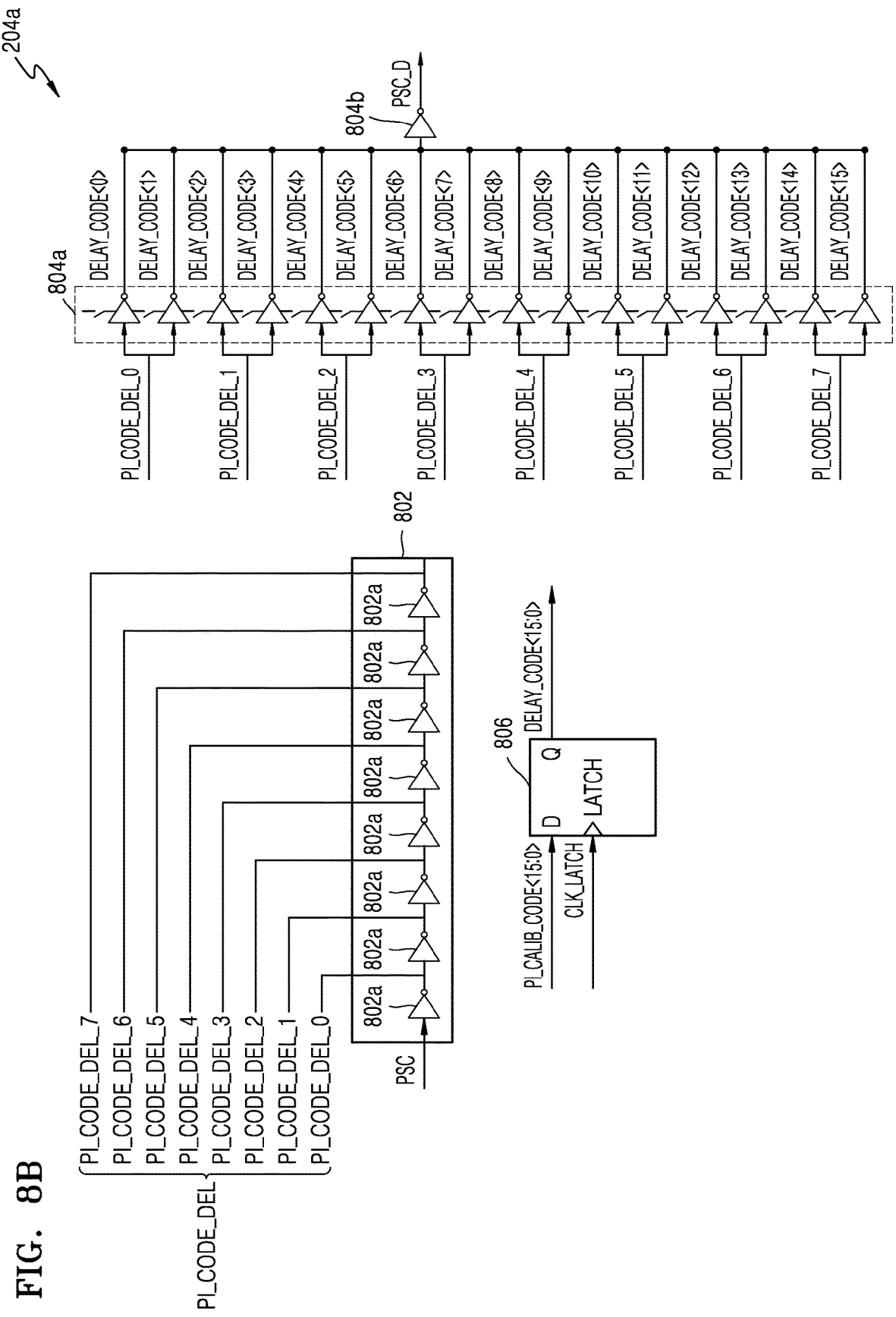

FIGS. 8a and 8b depict the variable delay circuit 204b for generating the delayed PI code PSC_D by adding the delay, corresponding to the delay code CODE_D received from the sensing circuitry 204a, to the PI code PSC, according to embodiments as disclosed herein.

As depicted in FIG. 8a, the variable delay circuit 204b includes a PI code delay generation module 802 (i.e., a PI code delay generation circuit), a multiplexer (MUX) 804, and a latch 806. In an embodiment, the MUX 804 may be implemented using a circuitry similar to the phase interpolator 202, which ensures that the delay of the phase interpolator 202 is low.

The PI code delay generation module 802 may be configured to receive the PI code PSC from the relevant internal circuitry of the integrated circuit device 200, and generate a plurality of PI delayed codes PI_CODE_DEL. In an embodiment, as depicted in FIG. 8b, the PI code delay generation module 802 may include a chain of multiple delay buffers 802a. The multiple delay buffers 802a may be configured to generate the plurality of PI delayed codes PI_CODE_DEL by adding a delay to the received PI code PSC. In an embodiment, the PI code delay generation module 802 may generate eight PI delayed codes PI_CODE_DEL_0 to PI_CODE_DEL_7 using eight delay buffers 802a. For example, a first delay buffer 802a may generate a first delayed PI code PI_CODE_DEL_0 by adding 25 picoseconds (ps) delay to the PI code PSC, so that the first delayed PI code PI_CODE_DEL_0 may include the 25 ps delay with reference to the PI code PSC. A second delay buffer 802a may add the 25 ps delay to the first delayed PI code PI_CODE_DEL_0 (which is already delayed by 25 ps with reference to the PI code PSC), so that the second delayed PI code PI_CODE_DEL_1 may include 50 ps delay with reference to the PI code PSC. Similarly, each of the remaining buffers may add the 25 ps delay to the received delayed PI codes to generate the remaining PI delayed codes. Thus, the first, second, third, fourth, fifth, sixth, seventh, and eighth PI delayed codes PI_CODE_DEL_0 to PI_CODE_DEL_7 may include delays of 25 ps, 50 ps, 75 ps, 100 ps, 125 ps, 150 ps, 175 ps, and 200 ps, respectively. The PI code delay generation module 802 provides the generated PI delayed codes PI_CODE_DEL_0 to PI_CODE_DEL_7 to the MUX 804.

The MUX 804 may be configured to generate the delayed PI code PSC_D from the plurality of PI delayed codes PI_CODE_DEL using the delay codes CODE_D received from the sensing circuitry 204a. The delay code CODE_D may include 16 PI calibration codes PI_CALIB_CODE<0> to PI_CALIB_CODE<15>. Thus, the delayed PI code PSC_D may be the PI code PSC including the variable delay. In an embodiment, the delayed PI code PSC_D may be present in between at least two of the PI delayed codes PI_CODE_DEL. The present invention is not limited thereto. In an embodiment, the delayed PI code PSC_D may be same as at least one of the PI delayed codes PI_CODE_DEL.

In an embodiment as depicted in FIG. 8b, the MUX 804 may include a plurality of interpolation buffers 804a for generating the delayed PI code PSC_D. The plurality of interpolation buffers 804a may receive the PI delayed codes PI_CODE_DEL from the PI code delay generation module 802 and the delay code CODE_D from the sensing circuitry 204a. According to the delay code CODE_D, the interpolation buffers 804a select at least two of the PI delayed codes PI_CODE_DEL, and interpolates between at least two of the PI delayed codes PI_CODE_DEL to calculate/output the delayed PI code PSC_D. The delayed PI code PSC_D may be present in between at least two of the PI delay codes PI_CODE_DEL. An output interpolation buffer 804b of the MUX 804 may drive the delayed PI code PSC_D to the phase interpolator 202.

Consider an example scenario as depicted in FIG. 8b, wherein the MUX 804 (including 16 interpolation buffers 804a) receives eight PI delayed codes PI_CODE_DEL_0 to PI_CODE_DEL_7 from the PI code delay generation module 802 and the delay code CODE_D from the sensing circuitry 204a. The delay code CODE_D may include sixteen PI calibration codes PI_CALIB_CODE<0> to PI_CALIB_CODE<15>. In an example embodiment, each of the sixteen PI calibration codes PI_CALIB_CODE<0> to PI_CALIB_CODE<15> may be a single bit code. Each PI delayed code of the eight PI delayed codes PI_CODE_DEL_0 to PI_CODE_DEL_7 may be generated by adding 25 picoseconds delay to the PI code PSC. In such a scenario, the same PI delayed code may be applied to two interpolation buffers 804a adjacent to each other. For example, a first PI delayed code PI_CODE_DEL_0 including 25 ps delay from the PI code PSC may be applied to first and second interpolation buffers; a second PI delayed code PI_CODE_DEL_1 including 50 ps delay from the PI code PSC may be applied to third and fourth interpolation buffers; a third delayed PI code PI_CODE_DEL_2 including 75 ps delay from the PI code PSC may be applied to fifth and sixth interpolation buffers or the like. The interpolation buffers 804a may be controlled using the delay code CODE_D received from the sensing circuitry 204a and select at least two PI delayed codes of the eight PI delayed codes PI_CODE_DEL_0 to PI_CODE_DEL_7 for interpolation. In an example, the interpolation buffers 804a may select the first delayed PI code PI_CODE_DEL_0 and the second delayed PI code PI_CODE_DEL_1 according to the received delay code CODE_D from the sensing circuitry 204a. In another example, the interpolation buffers 804a may select the first delayed PI code PI_CODE_DEL_0, the second delayed PI code PI CODE DELI for interpolation according to the received delay code CODE_D. The interpolation buffers 804a interpolate at least two PI delayed codes and output the delayed PI code PSC_D that is in between at least two PI delayed codes. For example, the first delayed PI code PI_CODE_DEL_0 including the 25 ps, and the second delayed PI code PI_CODE_DEL_1 including the 50 ps delay are selected for interpolation. In such a case, the interpolation buffers 804a interpolate the selected delayed PI codes PI_CODE_DEL_0 and PI_CODE_DEL_1 and generate the delayed PI code PSC_D that may be present in between the selected delayed PI codes PI_CODE_DEL_0 and PI_CODE_DEL_1. For example, the delayed PI code PSC_D may include the delay of 30 ps between the delays of 25 ps and 50 ps. The present invention is not limited thereto. In an embodiment, the interpolation buffers 804a may select and output one of the PI delayed codes PI_CODE_DEL (for example, the second delayed PI code PI_CODE_DEL_1 having 50 ps delay) as the delayed PI code PSC_D.

The latch 806 may be configured to prevent glitches at the delayed PI code PSC_D at the switching instant of the delay code CODE_D. The latch 806 may be enabled only when all the PI delayed codes PI_CODE_DEL_0 to PI_CODE_DEL_7 are at the same logic level/value. The latch 806 receives the delay code CODE_D having sixteen PI calibration codes PI_CALIB_CODE<0> to PI_CALIB_CODE<15> as a D input of the latch 806 and a clock latch signal CLK_LATCH as a clock signal of the latch 806, and provides the sixteen PI calibration codes PI_CALIB_CODE<0> to PI_CALIB_CODE<15> as an output Q of the latch 806. The latch 806 may be enabled only when the clock latch signal CLK_LATCH is high. When the clock latch signal CLK_LATCH is high, all the PI delayed codes PI_CODE_DEL_0 to PI_CODE_DEL_7 may be at the same logic level. When the clock latch signal CLK LATCH is high, the latch 806 provide the sixteen PI calibration codes PI_CALB_CODE<0> to PI_CALI_CODE<15> of the delay code CODE_D as output delay codes DELAY_CODE<0> to DELAY_CODE<15> to the MUX 804 to ensure zero glitches at the delayed PI code PSC_D. Thus, the latch 806 may be controlled to ensure that the switching of the output delay codes DELAY_CODE<0> to DELAY_CODE<15> is in the safe zone, which eliminates glitches at the delayed PI code PSC_D. For the simplicity of drawings, the number of the latch 806 is shown as one. The number of the latch 806 may be 16 according to the sixteen PI_CALB_CODE<0> to PI_CALB_CODE<15>. The clock latch signal CLK LATCH may be commonly supplied to the sixteen latches 806.

FIGS. 8a and 8b show exemplary units/components of the variable delay circuit 204b, but it is to be understood that other embodiments are not limited thereon. In other embodiments, the variable delay circuit 204b may include a smaller or greater number of units. Further, the labels or names of the units are used only for illustrative purpose and does not limit the scope of the embodiments herein. One or more units may be combined together to perform same or substantially similar function in the variable delay circuit 204b.

Figure 9:
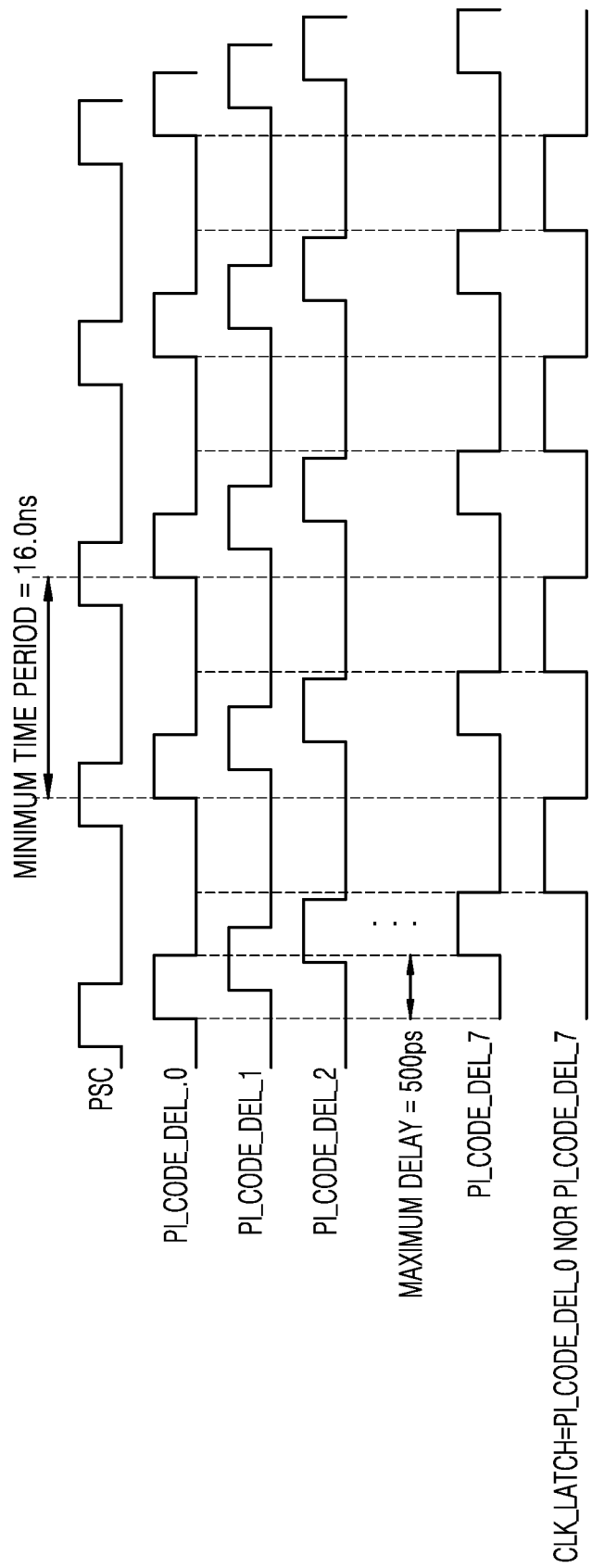
FIG. 9 is a timing diagram depicting the switching of the delay code, according to embodiments as disclosed herein.

FIG. 9 is a timing diagram depicting the switching of the delay code CODE_D, according to embodiments as disclosed herein. Example timing waveforms of the PI code PSC, the eight PI delayed codes PI_CODE_DEL_0 to PI_CODE_DEL_7, and the clock latch signal CLK LATCH are depicted in FIG. 9. The clock latch signal becomes high during a time when all the PI delayed codes PI_CODE_DEL_0 to PI_CODE_DEL_7 are at the same logic level (for example, a low logic level). When the clock latch signal becomes high, the delay code CODE_D (given as an input to the variable delay circuit 204b) may be switched/changed. Thus, the switching of the delay code CODE_D may occur in the safe zone, which may result in zero glitches at the delayed PI code PSC_D (which is the output from the variable delay circuit 204b).

Figure 10:
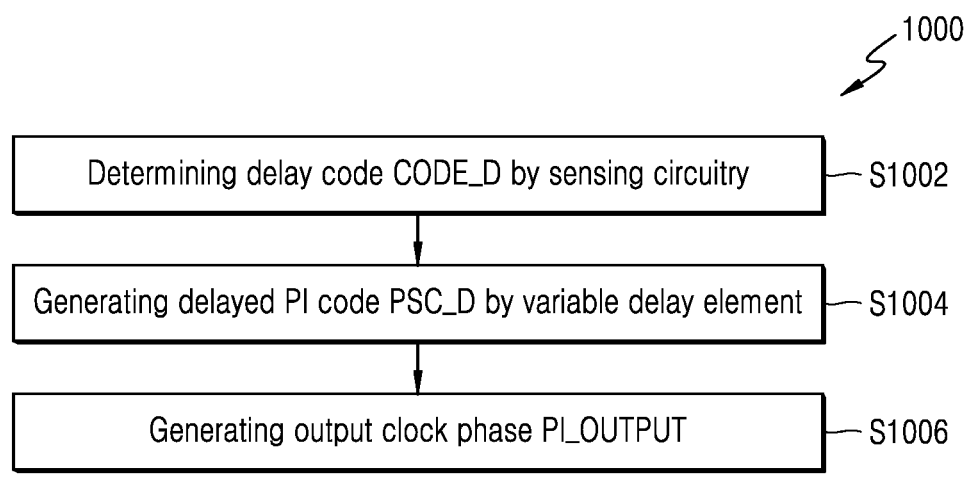
FIG. 10 is a flow diagram depicting a method for controlling an input of the phase interpolator in the integrated circuit device, according to embodiments as disclosed herein.

FIG. 10 is a flow diagram 1000 depicting a method for controlling the input of the phase interpolator 202 in the integrated circuit device 200, according to embodiments as disclosed herein.

At step S1002, the method includes determining, by the sensing circuitry 204a, the delay code CODE_D from the plurality of delay codes using the PI code PSC and the multiple input clock phases INPUT_CK. The sensing circuitry 204a performs the initialization of the delay code CODE_D by sensing phase relationship of the PI code PSC with respect to the clock inputs INPUT_K and determining if the PI code PSC is present in the safe zone or the unsafe zone for the plurality of delay codes. In an embodiment, the sensing circuitry 204a initializes the center one of the safe delay codes as the center delay code CDC. The sensing circuitry 204a further derives the early delay code EDC and the late delay code LDC using the initialized center delay code CDC. The sensing circuitry 204a uses the early delay code EDC, the center delay code CDC, and the late delay code LDC and derives the early PI code PI_CODE_EARLY, the center PI code PI_CODE_MID, and the late PI code PI_CODE_LATE. The sensing circuitry 204a performs the sampling of the clock inputs of the multiple input clock phases INPUT_K generated by the relevant oscillatory circuitry using the early PI code PI_CODE_EARLY, the center PI code PI_CODE_MID, and the late PI code PI_CODE_LATE as the clock signals to obtain the sampled values of the clock inputs of the multiple input clock phases INPUT_CK. The sensing circuitry 204a further performs the logic operation on the sampled values of the clock inputs with respect to the early PI code PI_CODE_EARLY, the center PI code PI_CODE_MID, and the late PI code PI_CODE_LATE and determines the early value EV, the middle value MV, and the late value LV. The sensing circuitry 204a uses the early value EV, the middle value MV, and the late value LV and determines the decision output. The sensing circuitry 204a accumulates the plurality of decision outputs and performs the integration operation on the plurality of decision outputs to generate the decimal/ integrated output. The sensing circuitry 204a converts the decimal value into the binary code and adds the binary code to the initialized delay code (i.e., the center delay code CDC generated from the initial calibration module 310a) to obtain the delay code CODE_D.

At step S1004, the method includes generating, by the variable delay circuit 204b, the delayed PI code PSC_D for the phase interpolator 202 using the PI code PSC and the determined delay code CODE_D, wherein the delayed PI code PSC_D is the PI code PSC including the variable delay. The variable delay circuit 204b generates the plurality of PI delayed codes PI_CODE_DEL by adding the delay to the PI code PSC. The variable delay circuit 204b uses the delay code CODE_D and interpolates between at least two of the plurality of PI delayed codes PI_CODE_DEL to determine or generate the delayed PI code PSC_D.

At step S1006, the method includes generating, by the phase interpolator 202, the output clock phase from the plurality of input clock phases using the delayed PI code PSC_D.

The various actions or steps in the flow diagram 1000 may be performed in the order presented, in a different order or simultaneously. Further, in some embodiments, some actions listed in FIG. 10 may be omitted.

Figure 11:
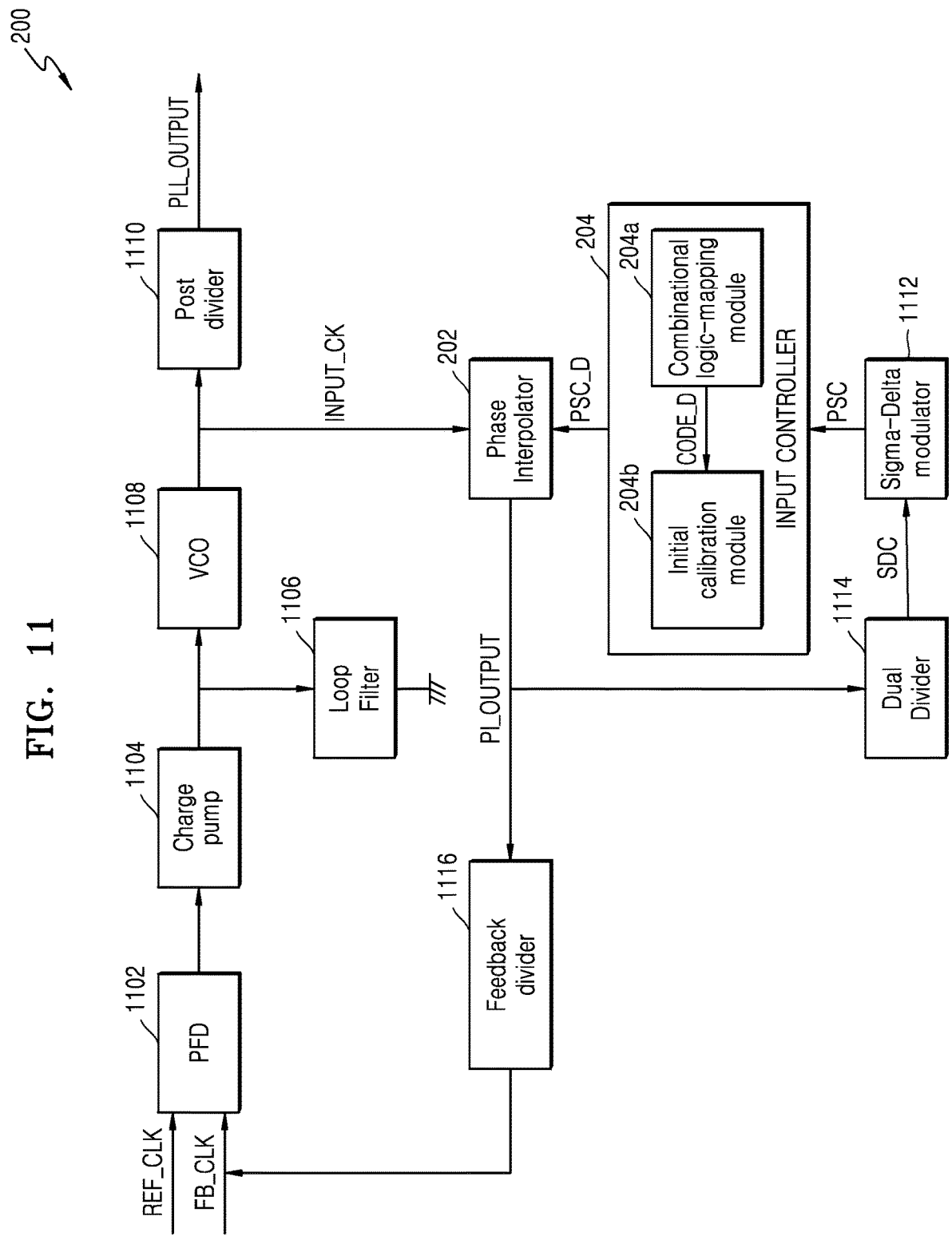
FIG. 11 depicts a PLL (an example integrated circuit device) including the phase interpolator, according to embodiments as disclosed herein.

FIG. 11 depicts a PLL which is included in the integrated circuit device 200. The PLL includes the phase interpolator 202, according to embodiments as disclosed herein. The integrated circuit device 200 including the PLL is an exemplary embodiment, but it may be obvious to a person skilled in the art that any other integrated circuit device may include the PLL.

As depicted in FIG. 11, the PLL includes a phase frequency detector (PFD) 1102, a charge pump 1104, a loop filter 1106, a voltage controlled oscillator (VCO) 1108, a post divider 1110, the phase interpolator 202, the input controller 204 including the sensing circuitry 204a, and the variable delay circuit 204b, a sigma-delta modulator (SDM) 1112, a dual divider 1114, and a feedback divider 1116.

The PFD 1102 receives a clock reference signal REF_CLK and a VCO feedback signal FB_CLK from the feedback divider 1116. The PFD 1102 compares the phases of the REF_CLK signal and the REF_CLK signal and generates an error signal. The error signal represents a phase difference between the clock reference signal REF_CLK and the VCO feedback signal FB_CLK. The charge pump 1104 generates an output current that represents the phase difference between the clock reference signal REF_CLK and the VCO feedback signal FB_CLK and feeds the output current to the loop filter 1106. The loop filter 1106 filters the output current to remove high frequency noise and generates an output voltage. The loop filter 1106 provides the generated output voltage as the control voltage to the VCO 1108. The VCO 1108 generates an output signal including multiple clock phases INPUT_CK. The post divider 1110 divides the output signal generated by the VCO 1108 to produce a PLL output signal PLL_OUTPUT. The VCO 1108 feeds the multiple clock phases of the generated output signal to the phase interpolator 202 as multiple input clock phases.

In a feedback path, the dual divider 1114 fetches an output of the phase interpolator 202, which is the output clock phase PI_OUTPUT, divides the output clock phase PI_OUTPUT to reduce the frequency of the output clock phase PI_OUTPUT, and provides a sigma delta clock SDC to the SDM 1112. On receiving the SDC from the dual divider 1114, the SDM 1112 generates the PI code PSC using the output clock phase PI_OUTPUT generated by the phase interpolator 202. The SDM 1112 provides the generated PI code PSC to the input controller 204.

On receiving the PI code PSC at the input controller 204 (i.e. on the PI code generation path), the sensing circuitry 204a of the input controller 204 determines the phase of the PI code PSC with respect to the input clock INPUT_CK generated from the VCO 1108, and predicts if the switching instant of the PI code PSC is in the safe zone or the unsafe zone for the delay code value of the center delay code CDC of FIG. 4b initialized/set during the initial calibration mode. Based on the prediction, the sensing circuitry 204a generates the delay code CODE_D of FIG. 2 by controlling/changing the initialized delay code value of the center delay code CDC of FIG. 4b to at least one other value or by retaining the initialized delay code (i.e., the center delay code CDC generated by the initial calibration module 310a). The sensing circuitry 204a may change or retain the initialized delay code by ensuring that the switching instant of the PI code PSC is in the safe zone. The sensing circuitry 204a provides the generated delay code CODE_D of FIG. 2 to the variable delay circuit 204b.

The variable delay circuit 204b generates the PI delayed codes PI_CODE_DEL by adding the delay generated based on the delay code CODE_D of FIG. 2 supplied from the sensing circuitry 204a to the received PI code PSC. The variable delay circuit 204b further selects at least two of the PI delayed codes PI_CODE_DEL and interpolates between at least two of the PI delayed codes PI_CODE_DEL using the delay code CODE_D received from the sensing circuitry 204a to generate the delayed PI code PSC_D. The delayed PI code PSC_D may be the PI code PSC including the variable delay and having the known phase relationship with respect to the input clock INPUT_CK received from the VCO 1108. Due to the known phase relationship with respect to the input clock INPUT_CK of the VCO 1108, the delayed PI code PSC_D may switch in the safe zone, thereby ensuring zero glitches at the output clock phases PI_OUTPUT. The variable delay circuit 204b provides the generated delayed PI code PSC_D to the phase interpolator 202.

The phase interpolator 202 chooses/selects at least two of the input clock phases, applies the interpolation function on the selected clock phases in accordance with the received delayed PI code PSC_D to generate the output clock phase PI_OUTPUT with zero glitches. The generated output clock phase PI_OUTPUT with zero glitches may optimize power consumption and reduce possibility of false frequency lock of the PLL. The output clock phase PI_OUTPUT may be a function of at least two input clock phases of the multiple input clock phases INPUT_CK. The phase interpolator 202 provides the output clock phase PI_OUTPUT to the feedback divider 1116. The feedback divider 1116 divides the output clock phase PI_OUTPUT to generate the VCO feedback signal FB_CLK that has an average frequency exactly same as the average frequency of the clock reference signal REF_CLK, which may be further provided to the PFD 1102.

Embodiments herein generate a delayed PI code having a known phase relationship with respect to an input clock and provide the delayed PI code as an input selection code to a phase interpolator for generating an output clock phase from multiple input clock phases.

Embodiments herein generate the delayed PI code by adding variable delay to a phase interpolator (PI) code. The generation of the delayed PI code for the phase interpolator includes adding a variable controllable delay in the input selection code to set phase relationship of the delayed PI code to a known value, determining the phase of the input selection code with respect to an oscillator clock, checking if the input selection code is in a glitch region (a region where a code switch may cause glitches at the output of phase interpolator), and varying the delay added in the input selection code until it is out of the glitch region, and varying the delay in the input selection code by dynamically tracking factors of the integrated device circuit such as, but not limited to, temperature, voltage drift (VT), and so on.

In an embodiment, generating the delayed PI code having a known phase relationship with respect to the input clock, and providing the delayed PI code as the input selection code to the phase interpolator for generating the output clock phase involves dynamically predicting and avoiding glitches due to supply voltage or temperature drift, ensuring that there are no glitches in the output of the phase interpolator and hence avoids false frequency lock, and enabling a wide frequency range of operation (10×) for the phase interpolator.

The embodiments disclosed herein may be implemented through at least one software program running on at least one hardware device and performing network management functions to control the elements. The elements shown in FIGS. 2-8b, may be at least one of a hardware device, or a combination of hardware device and software module.

The embodiments disclosed herein describe methods and systems for controlling an input of a phase interpolator. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device may be any kind of portable device that may be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the invention may be implemented on different hardware devices, e.g. using a plurality of CPUs.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein may be practiced with modification within the spirit and scope of the embodiments as described herein.

We claim:

1. An integrated circuit device comprising:
a sensing circuit receiving multiple input clock phases and a phase selection (PI) code and configured to determine a delay code from a plurality of delay codes using the PI code and the multiple input clock phases;
a variable delay circuit coupled to the sensing circuit and configured to:
generate a variable delay based on the delay code; and
generate a delayed PI code using the PI code and the delay code, wherein the delayed PI code corresponds to a code obtained from adding the variable delay to the PI code; and
a phase interpolator coupled to the variable delay circuit and configured to generate an output clock phase from the multiple input clock phases using the delayed PI code.

2. The integrated circuit device of claim 1,
wherein the plurality of delay codes represent a plurality of integer values which are determined based on time spacing between the PI code and the multiple input clock phases, and
wherein the PI code includes information to select a number of input clock phases from the multiple input clock phases, and an interpolation function to be applied on the number of input clock phases among the multiple input clock phases to generate the output clock phase.

3. The integrated circuit device of claim 1,
wherein the sensing circuit is further configured to:
set an initial value of the delay code by sensing a phase of the PI code with respect to at least one of the multiple input clock phases and determine if a switching instance of the PI code is present in a safe zone in which the multiple input clock phases are at the same logic level as each other;
determine a value of the delay code by controlling the initial value of the delay code;
identify a chain of safe delay codes among the plurality of delay codes, wherein safe delay codes of the chain of safe delay codes are evenly and consecutively spaced apart from each other; and
determine a centered safe delay code from the safe delay codes of the chain of safe delay codes,
wherein the centered safe delay code has a maximum symmetric margin compared to the other safe delay codes of the chain of safe delay codes, and
wherein a value of the centered safe delay code corresponds to the initial value of the delay code.

4. The integrated circuit device of claim 3,
wherein the sensing circuit is further configured to:
sample, for each delay code of the plurality of delay codes, the multiple input clock phases with reference to the PI code to obtain sampled values of the multiple input clock phases,
wherein the sampled values of the multiple input clock phases for each delay code of the plurality of delay codes represent logic levels of the multiple input clock phases at a switching instant of the PI code from a logic level 0 to a logic level 1;
perform a logic operation to determine if the sampled values of the multiple input clock phases for each delay code of the plurality of delay codes are at the same logic level at the switching instant of the PI code;
determine each delay code of the plurality of delay codes as a safe delay code or an unsafe delay code; and
identify the safe delay codes of the chain of safe delay codes from the plurality of delay codes after determining each delay code of the plurality of delay codes as the safe delay code or the unsafe delay code, and wherein the sensing circuit is further configured to determine, in response to the sampled values of the multiple input clock phases for a first delay code of the plurality of delay codes being determined as not being at the same logic level, the first delay code of the plurality of delay codes as a safe code or in response to the sampled values of the multiple input clock phases for the first delay code being determined as not being at the same logic level, the first delay code as an unsafe code.

5. The integrated circuit device of claim 4,
wherein the switching instant of the PI code is in the safe zone for the safe delay code, and
wherein the switching instant of the PI code is in an unsafe zone, in which the multiple input clock phases are not at the same logic level as each other, for the unsafe delay code.

6. The integrated circuit device of claim 4,
wherein the sensing circuit is further configured to:
select an early safe delay code and a late safe delay code using the centered safe delay code;
determine an early PI code, a middle PI code, and a late PI code by delaying the PI code using the early safe delay code, the centered safe delay code, and the late safe delay code respectively;
sample the multiple input clock phases with reference to each of the early PI code, the middle PI code, and the late PI code to generate the sampled values of the multiple input clock phases at a switching instant of each of the early PI code, the middle PI code, and the late PI code from the logic level 0 to the logic level 1;
determine an early value, a middle value, and a late value based on the sampled values of the multiple input clock phases at the switching instant of early PI code, the middle PI code, and the late PI code, respectively;
generate a plurality of decision outputs based on a combination of the early value, the middle value, and the late value, wherein each of the plurality of decision outputs indicate if the centered safe delay code has to be changed towards the early safe delay code by decreasing the centered safe delay code, if the centered safe delay code has to be changed towards the late safe delay code by increasing the centered safe delay code, or if the centered safe delay code has to be retained;
perform, after generating the plurality of decision outputs, an integration operation on the plurality of decision outputs to generate a decimal value;
decode the decimal value to determine a binary code; and
add the binary code to the centered safe delay code to determine the delay code.

7. The integrated circuit device of claim 6,
wherein the sensing circuit is further configured to perform a modulo operation on the delay code obtained by adding the binary code to the centered safe delay code.

8. The integrated circuit device of claim 7,
wherein the sensing circuit is further configured to:
select the safe delay code from the chain of safe delay codes that precedes the centered safe delay code by at least one position as the early safe delay code; and
select the safe delay code from the chain of safe delay codes that follows the centered safe delay code by at least one position as the late safe delay code.

9. The integrated circuit device of claim 7,
wherein the sensing circuit includes a plurality of groups of samplers,
wherein the plurality of groups of samplers include a first group of samplers configured to sample the multiple input clock phases with respect to the early PI code, a second group of samplers configured to sample the multiple input clock phases with respect to the middle PI code, and a third group of samplers configured to sample the multiple input clock phases with respect to the late PI code, and
wherein each of the plurality of groups of samplers include three D flip-flops.

10. The integrated circuit device of claim 7,
wherein the sensing circuit is further configured to:
perform a logic operation on the sampled values of the multiple input clock phases at the switching instant of the early PI code to determine the early value, wherein the early value represents if the sampled values of the multiple input clock phases are at the same logic level or not at a switching instant of early PI code;
perform the logic operation on the sampled values of the multiple input clock phases at the switching instant of the middle PI code to determine the middle value, wherein the middle value represents if the sampled values of the multiple input clock phases are at the same logic level or not at a switching instant of middle PI code; and
perform the logic operation on the sampled values of the multiple input clock phases at the switching instant of the late PI code to determine the late value, wherein the late value represents if the sampled values of the multiple input clock phases are at the same logic level or not at a switching instant of late PI code.

11. The integrated circuit device of claim 7,
wherein the sensing circuit is further configured to generate the plurality of decision outputs from the early value, the middle value, and the late value using a combinational-logic table.

12. The integrated circuit device of claim 11,
wherein the combinational-logic table includes a plurality of decision outputs, and
wherein each of the plurality of decision outputs is mapped with a corresponding combination of the early value, the middle value, and the late value.

13. The integrated circuit device of claim 7,
wherein the sensing circuit is further configured to:
perform the integration operation on the plurality of decision outputs to generate the decimal value,
wherein the decimal value is a value of the plurality of decision outputs added together, and
wherein the decimal value represents a cumulative shift to be applied on the centered safe delay code.

14. The integrated circuit device of claim 8,
wherein the variable delay circuit is further configured to:
generate a plurality of PI delay codes by adding the variable delay to the PI code;
select at least two of the plurality of PI delay codes using the delay code; and
interpolate between at least two of the plurality of PI delayed codes using the delay code to generate the delayed PI code, and
wherein the delayed PI code is in between at least two of the plurality of PI delayed codes or the delayed PI code is same as at least one of the plurality of PI delayed codes.

15. The integrated circuit device of claim 14,
wherein the variable delay circuit is configured to generate the delayed PI code which includes a known phase relationship with respect to the multiple input clock phases to ensure that switching of the delayed PI code occurs in the safe zone.

16. The integrated circuit device of claim 15,
wherein the variable delay circuit includes:
a PI code delay generating circuit configured to generate a plurality of PI delayed codes; and
a multiplexer configured to generate the delayed PI code,
wherein the phase interpolator is configured to, in response to the delayed PI code having the switching instant in the safe zone, generate the output clock phase with zero glitches.

17. The integrated circuit device of claim 14,
wherein the variable delay circuit further includes a latch configured to receive the delay code and generate, in response to the plurality of PI delay codes being at the same logic level, the delayed PI code.

18. An integrated circuit device comprising:
a sensing circuit receiving multiple input clock phases and a phase selection (PI) code and configured to determine a delay code from a plurality of delay codes using the PI code and the multiple input clock phases;
a variable delay circuit coupled to the sensing circuit and configured to:
generate a variable delay based on the delay code, and
generate a delayed PI code using the PI code and the delay code, wherein the delayed PI code corresponds to a code obtained from adding the variable delay to the PI code;
a phase interpolator coupled to the variable delay circuit and configured to generate an output clock phase from the multiple input clock phases using the delayed PI code; and
an oscillatory circuit configured to generate the multiple input clock phases.

19. The integrated circuit device of claim 18,
wherein the plurality of delay codes represent a plurality of integer values which are determined based on time spacing between the PI code and the multiple input clock phases, and
wherein the PI code includes information to select a number of input clock phases from the multiple input clock phases, and an interpolation function to be applied on the number of input clock phases among the multiple input clock phases to generate the output clock phase.

20. An integrated circuit device comprising:
a sensing circuit configured to:
receive a plurality of delay codes,
identify a chain of safe delay codes among the plurality of delay codes,
wherein safe delay codes of the chain of safe delay codes are evenly and consecutively spaced apart from each other,
determine a centered safe delay code from the safe delay codes of the chain of safe delay codes,
perform the integration operation on the plurality of decision outputs to generate a decimal value, wherein the decimal value is a value of the plurality of decision outputs added together, and wherein the decimal value represents a cumulative shift to be applied on the centered safe delay code,
decode the decimal value to determine a binary code;
add the binary code to the centered safe delay code to determine a delay code;
a variable delay circuit coupled to the sensing circuit and configured to:
receive a phase interpolation (PI) code,
generate a variable delay based on the delay code, and
generate a delayed PI code using the PI code and the delay code, wherein the delayed PI code corresponds to a code obtained from adding the variable delay to the PI code, and
a phase interpolator coupled to the variable delay circuit and configured to generate an output clock phase from a plurality of input clock phases using the delayed PI code.

* * * * *